(12) United States Patent
Ikeda

(10) Patent No.: US 7,529,282 B2
(45) Date of Patent: May 5, 2009

(54) APPARATUS FOR DRIVING LIGHT EMITTING ELEMENT AND SYSTEM FOR DRIVING LIGHT EMITTING ELEMENT

(75) Inventor: Chikaho Ikeda, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 172 days.

(21) Appl. No.: 11/341,498

(22) Filed: Jan. 30, 2006

(65) Prior Publication Data

US 2006/0133435 A1    Jun. 22, 2006

Related U.S. Application Data

(62) Division of application No. 10/090,146, filed on Mar. 5, 2002, now Pat. No. 7,352,786.

(30) Foreign Application Priority Data

Mar. 5, 2001 (JP) .............................. 2001-060403
Feb. 26, 2002 (JP) .............................. 2002-049925

(51) Int. Cl.
*H01S 3/00* (2006.01)

(52) U.S. Cl. .............. 372/38.07; 372/38.02; 372/38.01; 372/38.1

(58) Field of Classification Search .............. 372/38.01, 372/38.02, 38.03, 38.1, 38.07
See application file for complete search history.

(56) References Cited

U.S. PATENT DOCUMENTS

| | | | |
|---|---|---|---|
| 3,673,431 A * | 6/1972 | O'Brien | 345/60 |
| 4,539,686 A * | 9/1985 | Bosch et al. | 372/26 |
| 4,806,873 A * | 2/1989 | Nagano | 359/333 |
| 5,036,519 A | 7/1991 | Ema et al. | |
| 5,237,579 A | 8/1993 | Ema et al. | |
| 5,264,938 A | 11/1993 | Nobue | |
| 5,315,606 A * | 5/1994 | Tanaka | 372/38.02 |
| 5,349,595 A * | 9/1994 | Ogawa et al. | 372/38.02 |
| 5,414,280 A | 5/1995 | Girmay | |
| 5,444,728 A | 8/1995 | Thompson | |
| 5,717,627 A | 2/1998 | Mizushima | |
| 5,978,124 A | 11/1999 | Maekawa et al. | |
| 5,991,320 A | 11/1999 | Nakayama | |
| 6,044,095 A | 3/2000 | Asano et al. | |
| 6,097,159 A * | 8/2000 | Mogi et al. | 315/151 |
| 6,111,367 A * | 8/2000 | Asano et al. | 315/291 |
| 6,118,798 A | 9/2000 | Ema et al. | |
| 6,154,086 A | 11/2000 | Manolescu | |

(Continued)

FOREIGN PATENT DOCUMENTS

JP    A-53-61290    6/1978

(Continued)

*Primary Examiner*—Minsun Harvey
*Assistant Examiner*—Delma R Forde
(74) *Attorney, Agent, or Firm*—Oliff & Berridge, PLC

(57) ABSTRACT

In case of driving each of light emitting parts of a surface emitting laser, each of light emitting parts is made to be in forward-bias state and switches appropriately change bias voltage, which is lower than laser oscillation threshold voltage, and drive voltages, which are not less than the laser oscillation threshold voltage to directly apply the changed voltage to each of drive ends of the light emitting parts. Whereby, each of light emitting parts is driven.

15 Claims, 21 Drawing Sheets

U.S. PATENT DOCUMENTS

| | | | |
|---|---|---|---|
| 6,198,497 B1 | 3/2001 | Luque | |
| 6,222,357 B1 | 4/2001 | Sakuragi | |
| 6,259,714 B1 | 7/2001 | Kinbara | |
| 6,288,693 B1* | 9/2001 | Song et al. | 345/68 |
| 6,345,062 B1 | 2/2002 | Taguchi et al. | |
| 6,380,689 B1* | 4/2002 | Okuda | 315/169.3 |
| 6,510,168 B1* | 1/2003 | Kikuchi | 372/38.02 |
| 6,552,703 B1* | 4/2003 | Ushigusa | 345/77 |
| 6,639,924 B2 | 10/2003 | Kato et al. | |
| 6,795,656 B1* | 9/2004 | Ikeuchi et al. | 398/197 |
| 6,798,797 B2* | 9/2004 | Mangano et al. | 372/29.01 |
| 6,806,852 B2* | 10/2004 | Ishizuka et al. | 345/77 |
| 6,826,215 B2 | 11/2004 | Tsuji et al. | |
| 6,967,978 B2* | 11/2005 | Ohmori | 372/38.02 |
| 7,126,568 B2* | 10/2006 | LeChevalier | 345/84 |
| 7,245,277 B2* | 7/2007 | Ishizuka | 345/78 |
| 2001/0020923 A1* | 9/2001 | Homma | 345/60 |
| 2002/0057233 A1* | 5/2002 | Ishizuka et al. | 345/76 |
| 2002/0122308 A1* | 9/2002 | Ikeda | 362/259 |
| 2002/0196215 A1* | 12/2002 | Tsuchida et al. | 345/82 |
| 2003/0189961 A1* | 10/2003 | Tsuji et al. | 372/38.02 |
| 2003/0231663 A1* | 12/2003 | Ohtsuki et al. | 372/22 |
| 2004/0223008 A1* | 11/2004 | Ishizuka et al. | 345/690 |
| 2005/0002429 A1* | 1/2005 | Nakatani | 372/38.02 |
| 2005/0259054 A1* | 11/2005 | Wu | 345/82 |
| 2006/0125744 A1* | 6/2006 | Klein et al. | 345/82 |

FOREIGN PATENT DOCUMENTS

| | | |
|---|---|---|
| JP | A-57-13790 | 1/1982 |
| JP | A-59-18964 | 1/1984 |
| JP | A-61-78178 | 4/1986 |
| JP | A-09-055082 | 2/1997 |
| JP | A-10-126007 | 5/1998 |
| JP | A-11-68198 | 3/1999 |

* cited by examiner (VOLTAGE DRIVE)

(CURRENT DRIVE)

(WHEN TURNING OFF LASER)

(WHEN APC)

APPARATUS FOR DRIVING LIGHT EMITTING ELEMENT AND SYSTEM FOR DRIVING LIGHT EMITTING ELEMENT

This is a Division of application Ser. No. 10/090,146 filed Mar. 5, 2002. The entire disclosure of the prior application is incorporated by reference herein in its entirety.

BACKGROUND OF THE INVENTION

1. Field of the Invention

The present invention relates to an apparatus for driving a light emitting element and a system for driving light emitting elements, which drive a light emitting element by causing a direct current to flow thereto, and in particular the invention relates to a preferred apparatus for driving a light emitting element and a preferred system for driving the same, which are used to drive a light emitting element having a large interval resistance (series resistance), represented by a surface emission type laser element.

2. Description of the Related Art

High resolution and high speed have been demanded in the field of laser xerography using a laser beam as a light source. There is a limitation in the speed (hereinafter called "modulation speed") for controlling ON and OFF of the drive of a laser element in response to input image data. If an attempt is made to raise not only the resolution power in the main scanning direction but also the resolution power in the sub-scanning direction where the number of laser beams is singular, the modulation speed will be more or less sacrificed. Therefore, in order to raise the resolution power in the sub-scanning direction without raising the modulation speed, there is no way other than the number of laser beams is increased. Where it is assumed that the modulation speed is identical to that in the case where the number of laser beam is singular if the number of laser beams is made, for example, four, the resolution power in the main scanning direction and subscanning direction may be increased double.

However, the semiconductor laser is roughly classified into an edge emitting type laser element (hereinafter called an "edge emitting laser") having such a structure in which a laser beam is picked up in a direction parallel to the active layer, and a surface emission type laser element (hereinafter called a "surface emitting laser") having such a structure in which a laser beam is picked up in a direction perpendicular to the active layer. Conventionally, the edge emitting laser has generally been used as a laser light source in laser xerography.

However, in view of increasing the number of laser beams, the edge emitting laser has a technical difficulty. A surface emitting laser is more advantageous to increase the number of laser beams than the edge emitting laser in terms of structure. Based on such a reason, recently, an apparatus employing, as a laser light source, a surface emitting laser that is able to emit a number of laser light beams has been advanced in order to meet higher resolution power and higher speed in laser xerography.

Herein, a description is given of a laser driving apparatus that has been used for laser xerography. The laser driving apparatus is roughly classified into three types, one of which is a voltage drive type, another of which is a current output/voltage drive type, and the other of which is a current drive type. Hereinafter, a description is given of the respective types of laser driving apparatus.

First, such a structure that controls voltage applied to a laser element directly at the drive circuit side has been known as to the voltage drive type laser driving apparatus (For example, refer to Japanese Unexamined Patent Publication No. 1999-68198). Since the laser driving apparatus is devised so as to control the optical power by directly controlling the power source voltage of a logic gate, it can be constructed at a remarkably cheap cost.

Next, as to the current output/voltage drive type laser driving apparatus, such a structure has been known, in which the current source and laser element are connected to each other in series, and a drive voltage is generated in the vicinity of the laser element by using a termination resistor that is connected in parallel to the laser element (For example, refer to Japanese Unexamined Patent Publication No. 1984-18964). In the case of the laser driving apparatus, an output is a current flowing through the current source, and it is comparatively easy to generate an optional current in comparison with generation of a number of voltages having low output impedance.

Finally, as to the current drive type laser driving apparatus, such a structure has been known, in which a current generated by a constant current circuit is controlled so as to be turned on and off by a current switch and is provided into a laser element (For example, refer to Japanese Unexamined Patent Publication No. 1983-13790). Conventionally, with regard to driving of the edge emitting laser, this type of current drive type laser driving apparatus has been generally employed. The reasons are as follows;

As shown in FIG. 26, since the drive current is exponential-functionally increased with respect to an application voltage in the edge emitting laser, a differential resistance ($\Delta V/\Delta I$) fluctuates, depending on a bias point if the drive current is controlled by a voltage, wherein since nonlinear elements are generated in a negative feedback loop for control, the control becomes difficult. To the contrary, if the edge emitting laser is driven by a current, since the optical power is proportionate to the current over the threshold current of laser oscillation, the negative feedback loop is constituted with linear elements, wherein the control can be facilitated. Further, even in the case of driving a number of laser elements, it is possible to comparatively easily provide current sources for respective laser elements if the electric drive is adopted.

Herein, a description is given of a difference in the electrical aspect in view of drive between a surface emitting laser, which can be used for laser xerography, and a conventional edge emitting laser. The difference resides, as shown in FIG. 26, in that, although a current exponential-functionally increases to 100 mA or so with respect to an application voltage onto a laser element in a conventional edge emitting laser, the current is very small like several hundreds of microampere in the edge emitting laser, and the voltage-current characteristics may become linear.

The reason is as follows; That is, wherein the edge emitting laser is used for xerography, it is necessary to cause the light emitting laser to emit light in a single mode so that the laser light does not diffuse. Therefore, the area of light emission should be throttled. If the area of light emission is throttled, the area of conjunction may be narrowed, thereby resulting in an increase in the value of internal resistance in an equivalent circuit of a surface emitting laser, which is shown in FIG. 27. Accordingly, with only a flow of small current, the voltage-current characteristics may become linear.

On the other hand, if a current is increased in the case of an edge emitting laser, the voltage-current characteristics finally become linear due to a cause of the internal resistance. However, the current value entering the linear area is greater by one or more digits than that of the surface emitting laser. That is, in the equivalent circuit shown in FIG. 28, the value of internal resistance becomes several hundreds of ohms ($\Omega$) in the surface emitting lasers while the value of the internal resistance is several tens of ohms (Ω) in the edge emitting laser. The former becomes greater by one or more digits than the latter.

Where the surface emitting laser is further provided with a number of light emission parts that emit a number of laser beams in order to meet a request of higher resolution power and higher speed in laser xerography, the drive apparatus tends to become large in size since it must drive a number of light emission parts. Therefore, as shown in FIG. 29, the distance of routed wires is lengthened. Also, as has been made clear in FIG. 29, a number of routed wires are arranged in parallel to each other, wherein the parasitic capacitance will be increased to cause crosstalk to be liable to occur due to between-wire capacitance and common impedance.

In view of the modulation speed, in the case of the edge emitting laser, the value of internal resistance is small (See FIG. 28), and the length of the routed wires is short as shown in FIG. 30, wherein the parasitic capacitance is small. As a result, since a time constant τ that is determined by a resistance value R of the internal resistance and capacitance C of the parasitic capacitance is small, rise and fall of the drive current waveform are made steep as shown in FIG. 32. On the other hand, in the case of an edge emitting laser, as described above, the value of the internal resistance is large (See FIG. 27), and the wiring length is long, wherein the capacitance including parasitic capacitance with adjacent wires is made large, and the time constant τ becomes large. Accordingly, as shown in FIG. 31, the rise and fall of the drive current waveform become remarkably slow.

In the current drive type laser driving apparatus according to a prior art example, which has been described above, only 1 nsec is sufficient to start the edge emitting laser. To the contrary, in the case of the surface emitting laser, the time constant increases several tens of times in comparison with the time constant of the edge emitting laser, wherein the modulation speed is several tens of MHz. This implies that the modulation speed does not rise as a whole although the number of emitting laser beams is multiple. Therefore, unless the modulation speed is remarkably improved, there is no advantage in using the surface emitting laser as the laser light source in laser xerography.

In the above-described viewpoint, in order to drive a surface emitting laser that is able to emit a number of laser beams, the voltage drive type laser driving apparatus is more advantageous than the current drive type laser driving apparatus. That is, where it is assumed that the current drive type driving apparatus has an idealistic current source and the voltage drive type driving apparatus has an idealistic voltage, it is considered that these have an infinite resistance and a zero resistance value Ro in parallel to stray capacitance C at the drive end of a light emitting element having an internal resistance value Ri, which is a subject to be driven, with respect thereto. Therefore, a resistance component R of a time constant CR by which the speed of rise and fall can be regarded as parallel synthetic resistance of Ro and Ri, wherein the former is mainly the internal resistance of a light emitting element while the latter is mainly a resistance value at the driving apparatus side. Also, in the case of the current output/ voltage drive type laser driving apparatus, there is a system in which a current output is caused to flow into a resistor connected to a laser element in parallel, and the laser element is driven by its voltage drop. However, it is necessary to lower the resistance value of a parallel resistor in order to raise the modulation speed, wherein consumption power will be accordingly increased remarkably.

Here, the voltage drive type laser driving apparatus described in Japanese Unexamined Patent Publication No. 1999-68198 is taken into consideration again. The voltage drive type laser driving apparatus according to the prior art example employs a CMOS logic gate 101 as shown in FIG. 33. Two potentials of the ground level and power source voltage are changed over, and the voltage is applied to a laser element 103 via a resistor 102. At the same time, the back light outputted from the laser element 103 is received by a photo diode 104, and the power source voltage of the logic gate 101 is directly controlled on the basis of the received optical power via a feedback circuit 105, whereby the optical power can be automatically controlled so that the laser element 103 emits light at an appointed optical power. Also, the feedback circuit 105 is provided with a voltage source 106 to control the optical power.

However, in the voltage drive type laser driving apparatus thus constructed according to the prior art example, controllability is secured by providing a resistor 102 between the logic gate 101 and the laser element 103 and substantially driving laser elements with a current. Therefore, where the surface emitting laser is driven in the voltage drive type laser driving apparatus according to the prior art example, the resistor 102 that intervenes between the logic gate and the surface emitting laser becomes a factor of suppressing the modulation speed, which hinders an increase in the modulation speed.

Also, where a surface emitting laser that is a subject to be driven is applied to laser xerography, it is necessary that automatic light control is carried out for each of a number of light emission parts. Therefore, it is necessary to individually prepare a voltage source 106 for all of the logic gates 106 for drive. Further, since the power source of the logic gates is usually common, it is impossible to individually control a laser (light emission parts) by a single IC including a plurality of gates.

Also, at this time, performance requested for the voltage source 106 is such that the output impedance is low. Therefore, it is necessary to prepare a countermeasure of generally increasing a bias current in order to provide a decoupling capacitor of power source output in an IC chip and to lower the output impedance of the power source circuit. However, if a decoupling capacitor is provided, or a countermeasure of increasing the bias current is taken, it becomes a large limitation in designing IC chips in the view point of mounting and consumption power.

The present invention was developed in view of the above-described and other situations, and it is therefore an object of the invention to provide an apparatus for driving a light emitting element and a system for driving light emitting elements that is able to drive light emitting elements such as surface emitting lasers, etc., and enable higher modulation speed without any increased in the consumption power and without any limitation in the circuit integration (CI).

SUMMARY OF THE INVENTION

An apparatus for driving a light emitting element according to a first aspect of the invention is constructed so that a light emitting element is driven by substantially directly applying a voltage corresponding to input data to a drive end of the light emitting element that emits light by causing a direct current to flow thereto. In the apparatus for driving a light emitting element, which is constructed as described above, no resistance component that becomes a factor of suppressing the modulation speed intervenes between the corresponding driving apparatus and a drive end of the light emitting element which becomes a subject to be driven. Therefore, since the light emitting element can be substantially directly driven with voltage, a higher modulation speed can be achieved. As to the light emitting element which becomes a subject to be driven, a light emitting element whose internal resistance is comparatively large, such as a surface emitting laser and an EL (electroluminescence) element, is preferable.

In particular, the apparatus includes a voltage source; and switching section that is inserted between the voltage source and the light emitting element and is controlled on the basis of the input data, wherein the resistance value from the output end of the voltage source to the drive end of the light emitting element is established to be lower than the internal resistance value of the light emitting element. With this construction, the switching section selectively applies the voltage given from the voltage source to the drive end of the light emitting element on the basis of input data. At this time, the time constant with respect to rise of voltage is determined by a product obtained by multiplying parallel combined resistance of the resistance from the output end of the voltage source to the drive end of the light emitting element and the internal resistance of the light emitting element by parasitic capacitance resulting from the switching section and wires. Therefore, since the resistance value from the output end of the voltage source to the drive end of the light emitting element is smaller than the internal resistance value of the light emitting element, the time constant of rise of a drive voltage of the light emitting element can be decreased. Also, the ideal output resistance of the voltage source is zero. Further, as a matter of course, a resistance at the output end of the voltage source includes internal resistance (output resistance) of the voltage source in view of "technical concept of directly applying voltage" of the invention.

Furthermore, a current flowing through the voltage source is established to be smaller than a current flowing through the light emitting element. With this construction, where high speed drive is achieved by the current flowing through the voltage source being smaller than the current flowing through the light emitting element, the power consumption can be suppressed low in the voltage source, and the entire power consumption of the driving apparatus can be achieved, and the circuit integration thereof can be facilitated. In this connection, if an attempt is made to achieve high speed drive in the case where drive using an emitter follower (or a source follower) is taken into consideration, a greater current than the current flowing through the light emitting element must be caused to flow into a transistor of the emitter follower, wherein the power consumption of the driving apparatus will be increased, and integration of circuits will be made difficult.

The apparatus for driving a light emitting element according to the second aspect of the invention is constructed, in addition to the apparatus for driving a light emitting element, which is described in the first aspect, so that the voltage source includes a negative feedback loop that negatively feeds back an output and a buffer amplifier for amplifying an appointed input voltage. In the apparatus for driving a light emitting element thus constructed, since the buffer amplifier has a negative feedback loop, the current flowing through the voltage source can be established to be lower than the current flowing through the light emitting element. Further, since the output impedance can be established to be so small to disregard the same, the output potential of the switching section can be controlled to be fixed regardless of the load current. Therefore, it is possible to prevent the drive voltage from fluctuating in line with ON/OFF of the switching section.

The apparatus for driving a light emitting element according to the third aspect of the invention is constructed, in addition to the apparatus for driving a light emitting element, which is described in the second aspect, so that the voltage source has a capacitance section at an output of the buffer amplifier and the capacitance section of the voltage source has greater capacitance than the capacitance value of parasitic capacitance of the light emitting element, when being observed from the switching section. In the apparatus for driving a light emitting element thus constructed, the capacitance section compensates a decrease in the lowering effect of the output impedance due to negative feedback in line with a frequency. Also, since the capacitance value is larger than the capacitance value of the parasitic capacitance of the light emitting element when being observed from the switching section, it is possible to prevent the output voltage from fluctuating regardless of the load.

The apparatus for driving a light emitting element according to the fourth aspect of the invention is constructed, in addition to the apparatus for driving a light emitting element, which is described in the first aspect, so that the switching section changes an output voltage of the voltage source and a biasing voltage to bias the light emitting element on a basis of the input data. In the apparatus for driving a light emitting element thus constructed, since the output voltage of the voltage source and the bias voltage are adequately changed over by the switching section, and the bias voltage is applied in advance to the light emitting element when the light emitting element is turned off, it is possible to suppress, to a low level, the amplitude of the voltage applied from the voltage source to the light emitting element when driving the light emitting element.

The apparatus for driving a light emitting element according to the fifth aspect of the invention is constructed, in addition to the apparatus for driving a light emitting element, which is described in the second aspect, so that the apparatus further has an input side retaining section for retaining control voltage when controlling optical power at an input side of the buffer amplifier. In the apparatus for driving a light emitting element thus constructed, as drive of a laser in laser xerography, turning on and off the light emitting element is controlled in accordance with the image data and the optical power control can not be performed during the control of turning on and off the light emitting element. However, if the input side retaining section retains the voltage corresponding to the voltage when controlling optical power, it becomes possible from this that the light emitting element is modulated at desired optical power in an image data region (modulation region) without negative feed back control. The control voltage when controlling the optical power is retained by the input side retaining section, whereby shift to automatic optical power control mode can be performed smoothly.

The apparatus for driving a laser element as a light emitting element according to the sixth aspect of the invention is an apparatus for driving a laser element, which has a first voltage source for causing the laser element to be a forward biasing state and generating a first voltage that is lower than a threshold voltage of laser oscillation, a second voltage source for causing the laser element to be a forward biasing state and generating a second voltage that is larger than the threshold voltage of laser oscillation, and a switching section for changing the first voltage and the second voltage on a basis of the input data and applying the changed voltage directly to a drive end of the laser element, wherein a resistance value from an output end of the second voltage source and the drive end of the laser element is smaller than the internal resistance value of the laser element and a current flowing through the second voltage source is smaller than that flowing into the laser element. In the apparatus for driving a light emitting element thus constructed, if the first voltage is applied in advance to a laser element when the laser is turned off, it is possible to suppress, to a low level, the amplitude of the second voltage applied to the laser element when driving (modulating) the laser. At this time, the time constant of rise of the second voltage is determined by a product that is obtained by multiplying the parallel resistance of the resistance from the output end of the second voltage source to the drive end of the laser element and the internal resistance of the laser element by the parasitic capacitance resulting from the switching section and wires. Therefore, since the resistance from the output end of the second voltage source to the drive end of the laser element is smaller than the internal resistance value of the laser element, the time constant of rise of the drive voltage of the laser element can be made small.

Even in the case where high speed drive is achieved, the consumption power can be suppressed low since the current flowing through the second voltage source is smaller than the current flowing through the laser element, wherein the entire consumption power of the driving apparatus can be achieved, and integration of circuits thereof can be facilitated. In this connection, if an attempt is made to achieve high-speed drive in the case where drive using an emitter follower (or a source follower) is taken into consideration, a greater current than the current flowing through the laser element must be caused to flow into a transistor of the emitter follower, wherein the power consumption of the driving apparatus will be increased, and integration of circuits will be made difficult.

The apparatus for driving a light emitting element according to the seventh aspect of the invention is constructed, in addition to the apparatus for driving a light emitting element, which is described in the sixth aspect, so that the laser element is a surface emitting laser element. In the apparatus for driving a light emitting element thus constructed, the surface emitting laser is more advantageous in view of structure than an edge emitting laser in terms of increasing the number of laser light beams. Therefore, in the field of xerography, the surface emitting laser is used as a laser light source, wherein the surface emitting laser greatly contributes to high resolution power and high speed.

The apparatus for driving a light emitting element according to the eighth aspect of the invention is constructed, in addition to the apparatus for driving a light emitting element, which is described in the seventh aspect, so that the surface emitting laser element includes a plurality of light emitting parts emitting a plurality of laser beams and the first voltage is commonly applied to at least two of the light emitting parts of the plurality of light emitting parts. In the apparatus for driving light emitting elements thus constructed, since such a construction is employed in which the first voltage is commonly applied to two or more light emitting parts, it does not become necessary to provide voltage sources to apply the first voltage, equivalent to the number of the light emitting parts. Therefore, the circuit configuration of the entire voltage source can be simplified.

The apparatus for driving a light emitting element according to the ninth aspect of the invention is constructed, in addition to the apparatus for driving a light emitting element, which is described in the sixth aspect, so that at least latter of the first and second voltage sources has a negative feedback amplifying circuit having a buffer amplifier for amplifying an input voltage, the circuit for feeding back an output signal of the buffer amplifier to lower impedance of output of the buffer amplifier, and a capacitance section which has a larger capacitance value than the capacitance of parasitic capacitance of the laser element when being observed from the switching section and is connected to an output side of the buffer amplifier, and a resistance value from the output of the buffer amplifier to the laser element is smaller than a differential resistance value of the laser element when the laser emits light. In the apparatus for driving a light emitting element thus constructed, the time constant of rise of voltage when the laser is turned on is determined by a product that is obtained by multiplying the resistance value from the output end of the voltage source to the drive end of the surface emitting laser by the capacitance value of parasitic capacitance resulting from the switching section and wires. Therefore, since the resistance value from the output end of the voltage source to the drive end of the laser element is smaller than the internal resistance value of the laser element, the time constant of rise of the drive voltage of the laser element can be made small.

The apparatus for driving a light emitting element according to the tenth aspect of the invention is constructed, in addition to the apparatus for driving a light emitting element, which is described in the ninth aspect, so that the apparatus further has an input side retaining section for retaining control voltage when controlling optical power at an input side of the buffer amplifier. In the apparatus for driving light emitting elements thus constructed, as drive of a laser in laser xerography, turning on and off the light emitting element is controlled in accordance with the image data and the optical power control can not be performed during the control of turning on and off the light emitting element. However, if the input side retaining section retains the voltage corresponding to the voltage when controlling optical power, it becomes possible from this that the light emitting element is modulated at desired optical power in an image data region (modulation region) without negative feed back control. The control voltage when controlling the optical power is retained by the input side retaining section, whereby shift to automatic optical power control mode can be performed smoothly.

The apparatus for driving a light emitting element according to the eleventh aspect of the invention is constructed, in addition to the apparatus for driving a light emitting element, which is described in the tenth aspect, so that the apparatus further has a current supplying section for supplying a compensation current, which compensates a fluctuation of an output current of the negative feedback amplifying circuit due to changing of the switching section, to the drive end of the laser element. In the apparatus for driving a light emitting element thus constructed, as the output current of the negative feedback circuit fluctuates due to a fluctuation in load, terminal voltage of the laser element also fluctuates at the moment when the switching section is turned on. Therefore, if a compensation current is caused to flow into the drive end of the laser element in synchronization with the switching of the switching section, it is possible to suppress the fluctuation in the output current of the negative feedback circuit when the switching section is turned on.

The apparatus for driving a light emitting element according to the twelfth aspect of the invention is constructed, in addition to the apparatus for driving a light emitting element, which is described in the eleventh aspect, so that the current supplying section includes a current source and a second switching section for connecting the current source to the drive end of the laser element when the switching section changes to the second voltage source and for separating the current source from the drive end of the laser element when the switching section changes to the first voltage source. In the apparatus for driving a light emitting element thus constructed, since the switching section connects the current source to the drive end of the laser element or disconnects the same therefrom in synchronization with the switching of the switching section, it is possible to suppress a fluctuation in the output current of the negative feedback circuit regardless of the state of the switching section.

The apparatus for driving a light emitting element according to the thirteenth aspect of the invention is constructed, in addition to the apparatus for driving a light emitting element, which is described in the eleventh aspect, so that the current supplying section includes a current source having an MOS transistor and an MOS switch connected between the current source and the drive end of the laser element and the MOS transistor of the current source and the MOS switch are formed of a dual gate MOS transistor. In the apparatus for driving a light emitting element thus constructed, since an MOS transistor of the current source and an MOS switch thereof are formed of dual gate MOS transistors, the capacitance value of the parasitic capacitance of the source-drain at the connection portion of both transistors can be minimized. Therefore, response speed of the current source composed of MOS transistors can be accelerated.

The apparatus for driving a light emitting element according to the fourteenth aspect of the invention includes a voltage driving section for driving the light emitting element with voltage, a current driving section for driving the light emitting element with a current, and a switching section for changing voltage drive by the voltage driving section and current drive by the current driving section based on the input data. In the apparatus for driving a light emitting element thus constructed, voltage drive by the voltage driving section and current drive by the current driving section can be switched on the basis of input data, wherein it is possible to effectively combine advantages, which are brought about by the voltage drive, with those which are brought about by the current drive. Therefore, drive control nearer to the ideal can be achieved.

The apparatus for driving a light emitting element according to the fifteenth aspect of the invention is constructed, in addition to the apparatus for driving a light emitting element, which is described in the fourteenth aspect, so that the input data are pulse data and the switching section changes to the voltage drive by the voltage driving section in at least one of periods of rise and fall of the pulse data. In the apparatus for driving a light emitting element thus constructed, since voltage drive which is brought about by the voltage driving section is employed, for example, in the period of rise of pulse data, and current drive which is brought about by the current driving section is employed after the rise of pulse data, wherein the light emitting element can be instantaneously driven in response to the rise of pulse data, and at the same time, it is possible to prevent the optical power of the light emitting element from fluctuating as in a case where the voltage drive is continued even after the rise of the pulse data. As the at least one of periods, it is preferable to perform the voltage drive in the period of the rise (positive logic) or fall (negative logic) of the pulse data corresponding to a timing when the light emitting element turned off is turned on. In addition, The voltage drive may be performed in the period of the rise (negative logic) or fall (positive logic) of the pulse data corresponding to a timing when the light emitting element turned on is turned off.

The apparatus for driving a light emitting element according to the sixteenth aspect of the invention is constructed, in addition to the apparatus for driving a light emitting element, which is described in the fifteenth aspect, so that the switching section is able to simultaneously select the voltage drive by the voltage driving section and the current drive by the current driving section and the switching section simultaneously selects the current drive by the current driving section when being changed to the voltage drive by the voltage driving section to supply a current by the current drive to the light emitting element. In the apparatus for driving a light emitting element thus constructed, as the output current of the voltage driving section fluctuates due to a fluctuation in load, the terminal voltage of the light emitting element fluctuates at the moment when being changed by the changing section. Therefore, the current drive which is brought about by the current driving section is simultaneously selected when employing the voltage drive by the voltage driving section, and a current which is brought about by the corresponding current drive is provided to the light emitting element as a compensation current, wherein it is possible to suppress a fluctuation in the terminal voltage of the light emitting element.

The apparatus for driving a light emitting element according to the seventeenth aspect of the invention is constructed, in addition to the apparatus for driving a light emitting element, which is described in the fifteenth aspect, so that the voltage driving section includes a bias voltage applying section for applying bias voltage to the light emitting element and the switching section changes to the voltage drive by the voltage driving section in the period of rise of the pulse data, subsequently changes to the current drive by the current driving section, and thereafter changes to voltage drive by the bias voltage applying section in the period of fall of the pulse data. In the apparatus for driving a light emitting element thus constructed, if a bias voltage is applied in advance to a light emitting element when the light emitting element is turned off, it is possible to suppress, to a low level, the amplitude of a voltage applied from the voltage source to the light emitting element when driving the light emitting element.

The apparatus for driving a light emitting element according to the eighteenth aspect of the invention is constructed, in addition to the apparatus for driving a light emitting element, which is described in the fifteenth aspect, so that the voltage driving section includes a buffer section for amplifying an input voltage and an output side retaining section for retaining voltage corresponding to an output voltage of the buffer section at an output side of the buffer section and the switching section supplies the voltage retained by the output side retaining section to the light emitting element. In the apparatus for driving a light emitting element thus constructed, since the voltage corresponding to the input voltage is retained in the output side retaining section, the retaining voltage can be instantaneously applied to the light emitting element when being changed to the voltage drive.

The apparatus for driving a light emitting element according to the nineteenth aspect of the invention is constructed, in addition to the apparatus for driving a light emitting element, which is described in the eighteenth aspect, so that the voltage driving section includes an input side retaining section for retaining voltage corresponding to a control voltage when controlling optical power at the input side of the buffer section. In a driving apparatus for an image forming apparatus such as a driver for xerography, it is necessary that the optical power control is performed before entering the image area (modulation region) and the optical power at that time is stored and that an image is drawn with the stored optical power in the image area. The reason for storing the optical power as described above is because in the image area, turning on and turning off is performed in accordance with the image and therefore, the optical power control can not be performed when turning off. If the input side retaining section retains the control voltage corresponding to the voltage when controlling the optical power, it becomes possible from this that the light emitting element is modulated at desired optical power in the image data region (modulation region) without negative feed back control.

The apparatus for driving a light emitting element according to the twentieth aspect of the invention is constructed, in addition to the apparatus for driving a light emitting element, which is described in the eighteenth aspect, so that the current driving section includes a retaining section for retaining a voltage corresponding to the output voltage of the buffer section and a constant current source for outputting a current corresponding to the voltage retained by the retaining section and the switching section supplies a current outputted from the constant current source to the light emitting element. In the apparatus for driving a light emitting element thus constructed, a current that is outputted from the constant current source is supplied to a light emitting element as a compensation current for making fluctuation of load viewed from the voltage source be small when carrying out voltage drive, and, on the other hand, is supplied to the light emitting element as a drive current when carrying out current drive.

The apparatus for driving a light emitting element according to the twenty-first aspect of the invention is constructed, in addition to the apparatus for driving a light emitting element, which is described in the fifteenth aspect, so that the apparatus further has a compensating section for compensating a voltage of at least one of rise and fall of the pulse data, corresponding to a fluctuation in temperature of the light emitting element. In the apparatus for driving a light emitting element, a light emitting element is heated by causing a current to flow therein and the temperature thereof rises. This temperature rising reduces the terminal voltage of the light emitting element at the same optical power. However, if it is continued to be applying the same voltage to the light emitting element, the drive current increases and as a result, the optical power also increases. At least the voltage of the rise of the pulse data is compensated corresponding to the fluctuation in temperature, whereby optical power shift due to fluctuation amount in temperature can be compensated. Not only the rise of the pulse data but also the fall of the pulse data are compensated, whereby for example, it can also prevented that erroneous light emission is caused by fluctuation in laser oscillation threshold value due to the fluctuation in temperature.

The apparatus for driving a light emitting element according to the twenty-second aspect of the invention is constructed, in addition to the apparatus for driving a light emitting element, which is described in the twenty-first aspect, so that the compensating section detects a terminal voltage of the light emitting element and compensates the voltage on a basis of the detection result. In the apparatus for driving a light emitting diode thus constructed, the terminal voltage fluctuates in response to temperature of a light emitting element when a constant current flows into the light emitting element (when performing the current drive). Since it is possible to more quickly and more accurately monitor the temperature of the light emitting element by detecting the corresponding terminal voltage, the temperature can be securely compensated.

The apparatus for driving a light emitting element according to the twenty-third aspect of the invention is constructed, in addition to the apparatus for driving a light emitting element, which is described in the twenty-first aspect, so that the voltage driving section includes a bias voltage applying section for applying a bias voltage to the light emitting element, the current driving section includes a bias current supplying section for outputting a bias current corresponding to the bias voltage, and the switching section changes to the voltage drive by the voltage driving section in the period of rise of the pulse data, thereafter changes to the current drive by the current driving section, subsequently changes to the voltage drive by the bias voltage applying section in the period of fall of the pulse data, and changes to the current drive by the bias current supplying section in a period of OFF of the pulse data to supply the bias current to the light emitting element. In the apparatus for driving a light emitting diode thus constructed, when the light emitting element is shifted to the current drive after the light emitting element is voltage-driven at the bias voltage at the period of the fall of the pulse data, if the current value in the current drive is a current value corresponding to the bias voltage, the light emitting element can smoothly be shifted to the current drive. Therefore, when the terminal voltage in the current drive is detected to perform temperature compensation, a period in which the temperature compensation can not effect is made to be as small as possible.

Here, the bias current corresponding to the bias voltage will be described. Ideally, when the terminal voltage of the laser element is fallen, it is necessary to compensate the fall voltage in accordance with sensitivity as with a case where the terminal voltage of the laser element is risen. Thus, a circuit therefor is required. However, even if the rise voltage fluctuates more or less, since the laser element is turned off, the optical power is not fluctuated due to this. If the rise bias voltage does not have a relation in relation to the bias current at all, after one voltage is risen up to the bias voltage, a state is not a constant current drive state until settling at a voltage corresponding to the bias current. Therefore, at that time, the temperature compensation can not be performed by using the terminal voltage. In other words, if the turning-off period is shorter than this convergence period, next turning-on is started before the laser terminal voltage when turning off becomes the constant current operation. Therefore, the compensation can not be performed. Accordingly, it is necessary to set that the bias current corresponding to the bias voltage is made to flow in advance to shift to the constant current operation as early as possible.

The apparatus for driving a light emitting element according to the twenty-fourth aspect of the invention is constructed, in addition to the apparatus for driving a light emitting element, which is described in the twenty-first aspect, so that the voltage driving section includes a buffer section for amplifying an input voltage, an output side retaining section for retaining a voltage corresponding to the output voltage of the buffer section at the output side of the buffer section, and an input side retaining section for retaining a voltage corresponding to the control voltage when controlling optical power at the input side of the buffer section, in which the switching section supplies the voltage retained by the output side retaining section to the light emitting element, and the compensating section detects a terminal voltage of the light emitting element and compensates the retaining voltage of the input side retaining section on a basis of the detection result. In the apparatus for driving a light emitting element thus constructed, since the retaining voltage of the input side retaining section is compensated on the basis of the terminal voltage of the light emitting element, the compensated voltage is applied to the light emitting element via the output side retaining section. Therefore, it is possible to carry out compensation of the temperature when executing voltage drive.

The apparatus for driving a light emitting element according to the twenty-fifth aspect of the invention is constructed, in addition to the apparatus for driving a light emitting element, which is described in the twenty-fourth aspect, so that the compensating section has a detecting section for detecting the terminal voltage of the light emitting element and the compensating section compensates the retaining voltage of the input side retaining section on a basis of the detection result of the detection section. In the apparatus for driving a light emitting element thus constructed, the terminal voltage of the light emitting element is compared with the terminal voltage at a time when the retaining voltage of the input side retaining section is set and the retaining voltage of the input side retaining section is compensated on a basis of the error. Whereby the temperature compensation can be performed so that light power of emitting element becomes constant.

The apparatus for driving a light emitting element according to the twenty-sixth aspect of the invention is constructed, in addition to the apparatus for driving a light emitting element, which is described in the twenty-third aspect, so that the bias current supplying section detects the terminal voltage of the light emitting element and compensates the bias current so that the detected voltage coincides with the bias voltage. In the apparatus for driving a light emitting element thus constructed, since the bias voltage which is terminal voltage of the light emitting element at the period of fall of the pulse data is almost equal to the voltage when current-driving thereafter, the light emitting element is shifted to the current drive smoothly, light emitting pulse duty of the light emitting element is near 100%, and in a case where the turning-off period is short, voltage value of the rise voltage by the temperature compensation acts effectively at the period of next rise of the pulse data.

The apparatus for driving a light emitting element according to the twenty-seventh aspect of the invention is constructed, in addition to the apparatus for driving a light emitting element, which is described in the fifteenth aspect, so that a period of the voltage drive by the voltage driving section is set less than the minimum pulse width of the pulse data. In the apparatus for driving a light emitting element thus constructed, if the period of voltage drive meets the above-described conditions, the light emitting element can be securely driven in response to the rise (or fall) with respect to pulse data of any pulse width.

An apparatus according to the twenty-eighth aspect of the invention, for driving a light emitting element emitting light by causing a direct current to flow thereto, the apparatus has a compensating section for compensating fluctuation in temperature of the light emitting element on a basis of the terminal voltage of the light emitting element. In the apparatus for driving a light emitting element thus constructed, since the terminal voltage varies in accordance with the temperature of the light emitting element, the temperature of the light emitting element is monitored speedy and accurately by detecting the terminal voltage. Therefore, the temperature compensation can be performed steadily.

The apparatus for driving a light emitting element according to the twenty-ninth aspect of the invention is constructed, in addition to the apparatus for driving a light emitting element, which is described in the eighteenth, nineteenth, or twenty-sixth aspects, so that the input side and output side retaining sections are capacitors. In the apparatus for driving a light emitting element thus constructed, since the capacitor is a single element, configuration of the circuits can be remarkably facilitated by employing the capacitor as a retaining section.

The system for driving a light emitting element according to the thirtieth aspect of the invention is constructed, so that the system includes a plurality of apparatus for driving the light emitting elements in response to input data, the light emitting elements caused to emit light by flowing a direct current, the apparatus having a voltage source, and a switching section disposed between the voltage source and the light emitting element and controlled on a basis of the input data, a detecting section for detecting optical power of the plurality of light emitting elements, and a error amplifying section for comparing voltage corresponding to the detection result of the detecting section and a reference voltage to amplify the error therebetween, in which a resistance value from an output end of the voltage source to a drive end of the light emitting element is smaller than an internal resistance value of the light emitting element, a current flowing through the voltage source is smaller than a current flowing through the light emitting element, and each of the plurality of apparatus for driving light emitting elements drives the light emitting element on a basis of outputs of the error amplifying section. In the system for driving a light emitting element, the optical power of a light emitting element is detected, and the same is fed back to the respective apparatuses for driving light emitting elements, whereby the respective optical power of a plurality of light emitting elements are controlled to be fixed at all times.

The system for driving light emitting elements according to the thirty-first aspect of the invention is constructed, in addition to the system for driving light emitting elements according to the thirtieth or thirty-second aspect thereof, so that the error amplifying section includes an error amplifier inputted the detection result of the detecting section and the reference voltage and a plurality of negative feedback loops for negatively feeding back output of the error amplifier to inputs thereof, the negative feedback loops provided to corresponding number of the apparatuses for driving light emitting elements, in which each of the plurality of negative feedback loops includes a retaining section for retaining a voltage corresponding to the output voltage of the error amplifiers when controlling the optical power of the light emitting elements and a switching section connected to the retaining section in series, each of the plurality of apparatus for driving light emitting elements has an input side retaining section for retaining the retaining voltage of the corresponding retaining section in the plurality of negative feedback loops, and each of the plurality of apparatus for driving light emitting elements drives the light emitting element on a basis of the retaining voltage of the input side retaining section.

In the system for driving light emitting elements, negative feedback loops are provided in the error amplifying section, corresponding to the number of apparatus for driving light emitting elements, whereby the optical power can be securely controlled for the respective light emitting diodes. Since the retaining section of each of negative feed back loops retains voltage corresponding to the output voltage of the error amplifying section of corresponding light emitting element at a time of the last optical power control, when next optical power control is performed, the last output voltage of the error amplifying section can be reproduced by selecting the retaining section of corresponding negative feed back loop (corresponding to sum of the retaining section of the negative feed back loop and reference voltage). As a result, since the voltage retained in the input side retaining section (corresponding to the input side retaining section in the fifth, tenth, and nineteenth aspect of the invention) of the apparatus for driving light emitting element is matched the voltage retained in the retaining section of the negative feed back loops at once, the optical power control for each of light emitting elements can be performed fast and accurately with one error amplifying section as with a case where a plurality of apparatus for driving light emitting element each has the error amplifying section. Since one error amplifier controls the plurality of light emitting elements, even if the error amplifier has large offset, all light emitting elements are controlled with the same offset and variation among the light emitting elements does not occur.

A system for driving a light emitting element according to the thirty-second aspect of the invention is constructed, so that the system has an apparatus for driving a light emitting element in response to input data, the light emitting element emitting light by causing a direct current to flow thereto, the apparatus having a voltage driving section for driving the light emitting element with voltage, a current driving section for driving the light emitting element with a current, and a switching section for changing voltage drive by the voltage driving section and current drive by the current driving section based on the input data, a detecting section for detecting optical power of the plurality of light emitting elements, and a error amplifying section for comparing voltage corresponding to the detection result of the detecting section and a reference voltage to amplify the error therebetween, in which a resistance value from an output end of the voltage source to a drive end of the light emitting element is smaller than an internal resistance value of the light emitting element, a current flowing through the voltage source is smaller than a current flowing through the light emitting element, and each of the plurality of apparatus for driving light emitting elements drives the light emitting element on a basis of outputs of the error amplifying section.

DETAILED DESCRIPTION OF THE PREFERRED EMBODIMENTS

Hereinafter, a description is given of embodiments of the invention with reference to the accompanying drawings.

[Basic Concept]

Figure 1:
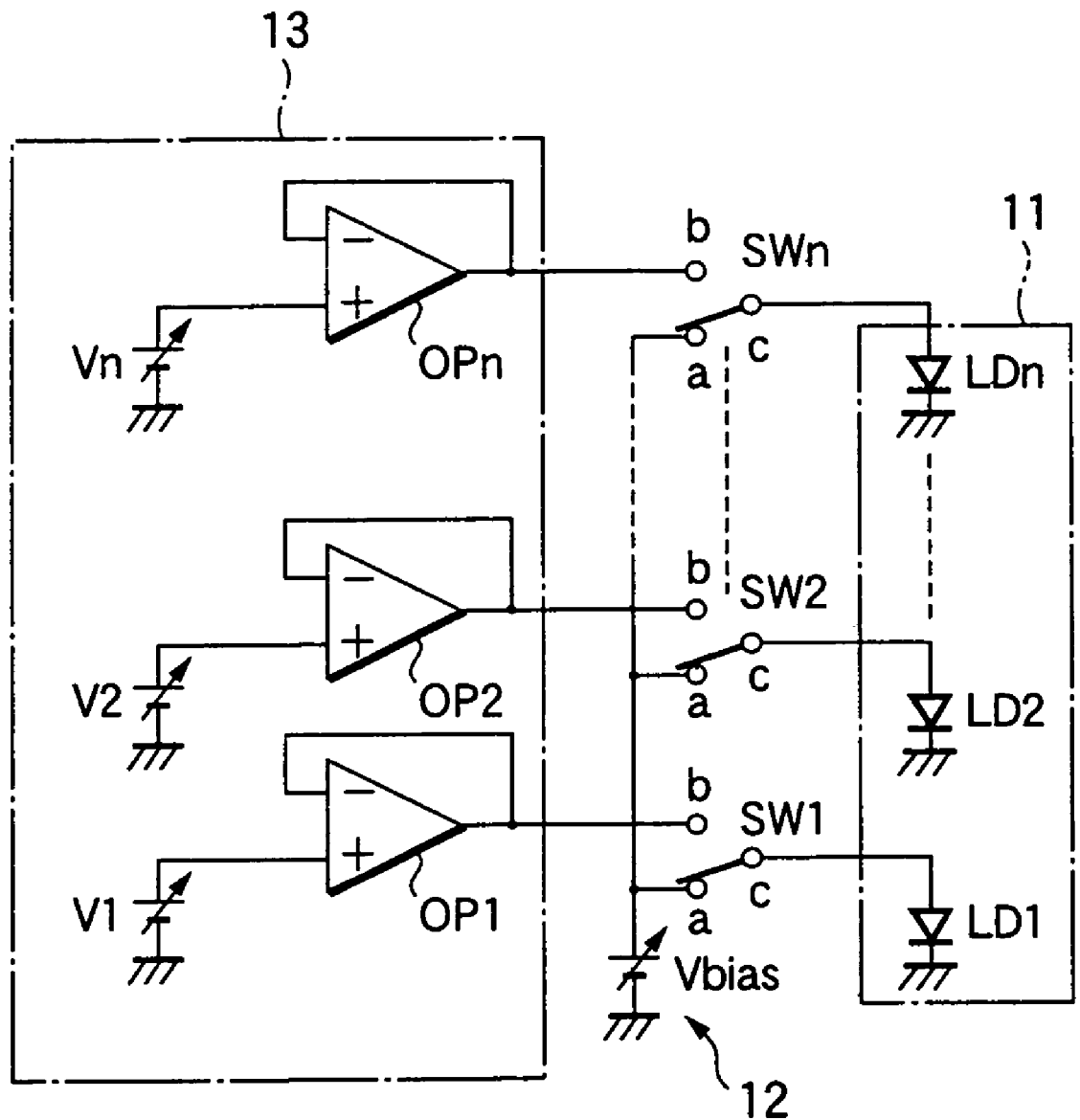
FIG. 1 is a block diagram showing the basic concept of an apparatus for driving a light emitting element according to the invention.

FIG. 1 is a block diagram showing the basic concept of an apparatus for driving a light emitting element according to the invention;

Herein, an example is shown, in which, for example, a surface emitting laser 11 having a number ("n") of light emitting parts LD1 through LDn for emitting respective laser light beams is employed as a light emitting element that becomes a subject to be driven. In FIG. 1, "n" light emitting parts LD1 through LDn of the surface emitting laser 11 are such that, for example, respective cathodes are grounded while respective anodes become drive ends, which are respectively connected to respective output terminals c of switches SW1 through SWn.

Bias voltage Vbias, being lower than a threshold voltage for laser oscillation, in which the light emitting parts LD1 through LDn are made into a forward-biased state, is commonly applied from the first voltage source 12 to input terminals a at one side of switches SW1 through SWn. Drive voltages (control voltages) V1 through Vn, being larger than the threshold voltage of laser oscillation, in which the light emitting parts LD1 through LDn are made into a forward-biased state, are applied from the second voltage source (variable voltage source) 13 to input terminals b at the other side of the switches SW1 through SWn.

The second voltage source 13 has operational amplifiers OP1 through Opn in which the drive voltages V1 through Vn are made into non-inverting (+) inputs, and is constructed so that the output potential is fed back as its inverting (−) input.

Also, as to the basic idea, such a construction may be employed, in which the operational amplifiers OP1 through Opn are omitted, and the drive voltages V1 through Vn are directly provided to the input terminals b at the respective other sides of the switches SW1 through SWn.

The switches SW1 through SWn adequately change over the bias voltage Vbias and drive voltages V1 through Vn and apply the same to the respective light emitting parts LD1 through LDn of the surface emitting laser 11. In detail, the switches SW1 through SWn are changed to the input terminal a side before applying the drive voltages V1 through Vn to the respective light emitting parts LD1 through LDn, and apply in advance the bias voltage Vbias, which is lower than the threshold voltage of laser oscillation, to the respective light emitting parts LD1 through LDn, and thereafter the switches SW1 through SWn are changed to the input terminal-b side and apply the drive voltages V1 through Vn, which are larger than the threshold voltage of laser oscillation, to the respective light emitting parts LD1 through LD2. For example, CMOS transfer gates may be employed as the switches SW1 through SWn.

Thus, the drive voltages V1 through Vn that are selected by the switches SW1 through SWn are applied from the respective output terminals c of the switches SW1 through SWn directly to the drive ends (anodes) of the light emitting parts LD1 through LDn of the surface emitting laser 11 in order to drive the respective light emitting parts LD1 through LDn, whereby since no resistance component that becomes a factor of suppressing the modulation speed exists between the respective output terminals of the switches SW1 through SWn and the respective drive ends of the light emitting parts LD1 through LDn, a high modulation speed can be achieved.

In addition, the bias voltage Vbias and drive voltages V1 through Vn are adequately changed over by the switches SW1 through SWn, and one of these is applied to the respective light emitting parts LD1 through LDn of the surface emitting laser 11. In detail, when the laser is turned off, by applying in advance a voltage, which is in a forward bias and lower than the threshold voltage of laser oscillation, it is possible to suppress, to a low level, the amplitude of the application voltage when performing modulation, wherein a quick shift to the modulation mode can be achieved.

The optical power of laser can be made uniform by individually controlling the drive voltages V1 through Vn for the respective light emitting parts LD1 through LDn, and it is possible to raise the modulation speed to the switching speed of the switches SW1 through SWn as long as the voltage sources 12 and 13 are idealistic. If transfer gates which are brought about by submicron MOS are used as the switches SW1 through SWn, it becomes possible to set the switching time (speed) to 1 nsec or less. As a result, it is possible to achieve a surface emitting laser driving apparatus in which individual power control and high speed modulation are compatible with each other with respect to the respective light emitting parts LD1 through LDn of the surface emitting laser 11.

Herein, it is assumed that the voltage sources 12 and 13 are idealistic. However, the idealistic voltage sources herein are voltage sources whose output impedance is several tens of ohms (Ω) or less, not depending the frequency.

Figure 2:
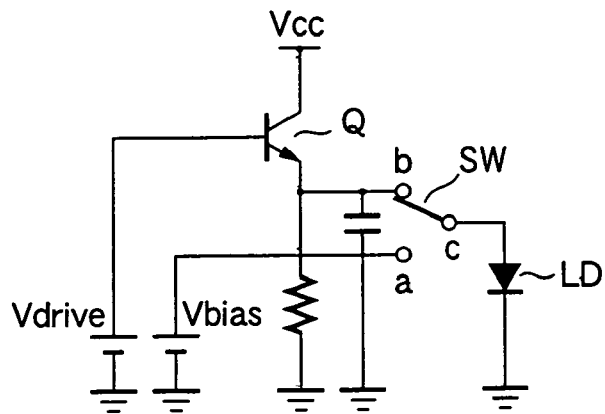
FIG. 2 is a circuit diagram showing a voltage drive circuit employing the emitter follower according to the related art.

The apparatus for driving a light emitting element is a voltage drive type. However, it belongs to a publicly known technology that the circuit elements are driven directly by voltage (For example, see Japanese Unexamined Patent Publication No. 1982-76884). Here, a description is given of a case where such voltage drive as shown in the publicly known technology is assumed, a switch SW is added thereto, and as shown in FIG. 2, the surface emitting laser (light emitting part) LD is driven by respectively applying a bias voltage Vbias to the input terminal a at one side of the switch SW and a drive voltage Vdrive to the input terminal b at the other side through a transistor Q of an emitter follower.

Figure 3:
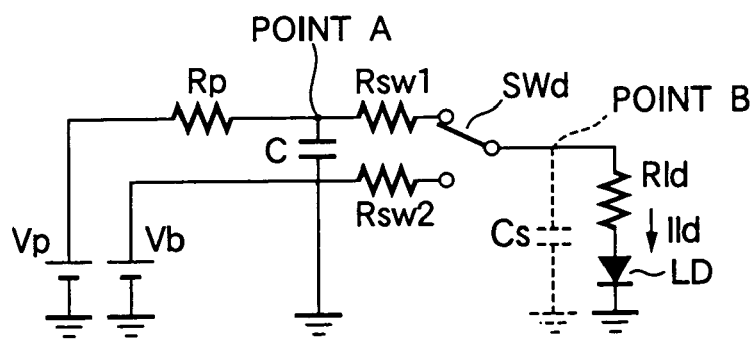
FIG. 3 shows an equivalent circuit of FIG. 2.

Herein, a bipolar transistor is employed as the emitter follower. However, the same effect can be brought about if a source follower using an FET (field-effect transistor), and a constant voltage element such as an avalanche diode, a Zener diode, etc., are employed. Such elements are equivalently expressed in terms of a voltage source Vp and internal resistance Rp as shown in FIG. 3. Also, it is normal that a decoupling capacitor C is provided so that voltage does not fluctuate at the moment when the switch SWd is changed over, and the rise characteristics of drive pulses are improved.

Figure 4:
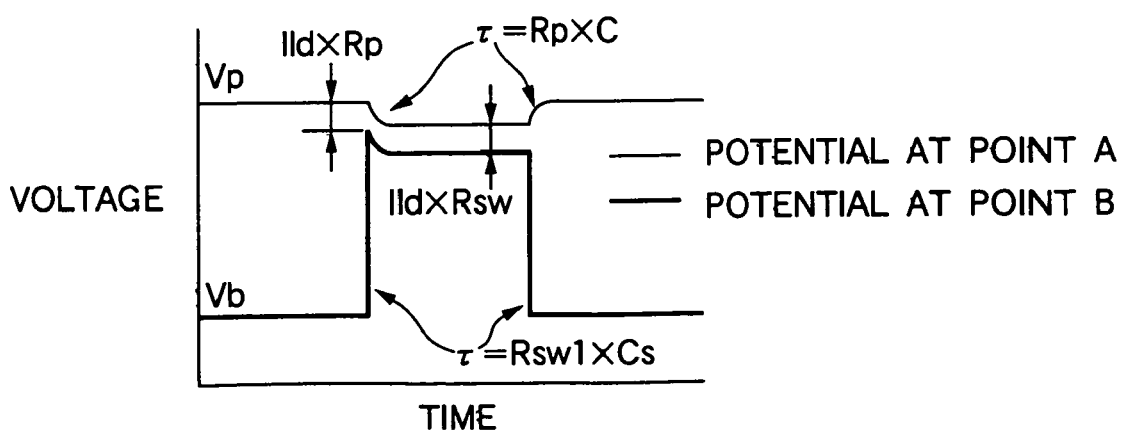
FIG. 4 shows an operation waveform of FIG. 2.

In a case where a current equivalent to the surface emitting laser LD is caused to flow into the transistor Q of the emitter follower in the equivalent circuit shown in FIG. 3, the switch SWd is changed in order of Vb side (bias voltage side)–Vp side (drive voltage side)–Vb side, wherein the potential at point B at the moment when having been changed to the Vb side decreases at a time constant Rp×C as shown in the waveform diagram of FIG. 4, and finally becomes a lower value equivalent to the amount of voltage drop at the internal resistance Rsw1 of the switch SWd due to a current into the surface emitting laser LD and the internal resistance Rp.

Thus, the reason why the laser drive voltage (potential at point B) fluctuates after the surface emitting laser LD is turned on is that no voltage drop occurs due to the internal resistance Rp of the voltage source Vp as the switch SWd is connected to the Vb side and the voltage source Vp is made into an unloaded state, and the decoupling capacitor C is charged by a voltage at an open terminal of the voltage source Vp. That is, if there is the internal resistance Rp of the voltage source Vp, overshoot occurs at the moment when the surface emitting laser LD is turned on.

Since a larger current than the current flowing through the surface emitting laser LD must be caused to flow into the transistor Q of the emitter follower if an attempt is made to achieve high speed drive in the case of the emitter follower (or the source follower), consumption power of the driving apparatus is increased. In particular, in a case of driving a surface emitting laser having a number of light emitting parts, a large current is caused to flow in respective transistors Q of the emitter follower provided by the number of the light emitting parts, wherein the entire consumption power of the driving apparatus becomes remarkably large, and integration of the circuits of the driving apparatus will become difficult.

Figure 5:
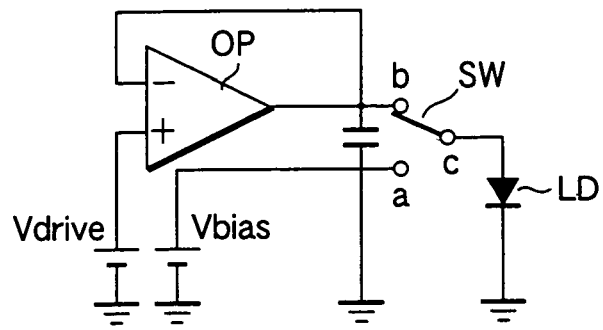
FIG. 5 is a circuit diagram showing a voltage drive circuit based on the basic concept of the invention.
Figure 6:
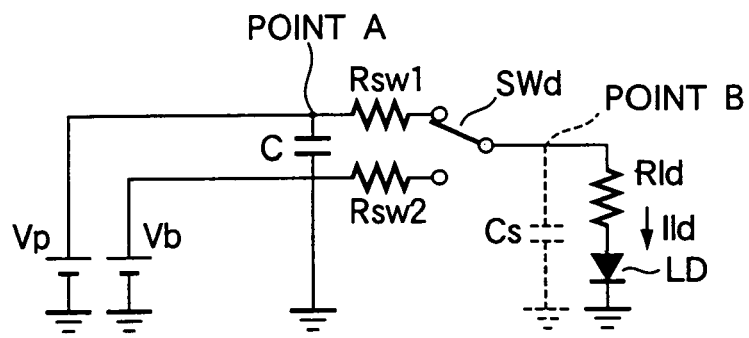
FIG. 6 shows an equivalent circuit of FIG. 5.

To the contrary, in the art based on the present basic concept showing a circuit configuration equivalent to one channel in FIG. 5, an operational amplifier OP, in which the impedance at point A can be made, so small as can be disregarded, by feeding back the potential at point A using the voltage source Vp in equivalent circuit shown in FIG. 6, is used. Also, an effect of a lowering of the output impedance due to the negative feedback is decreased in line with frequency. A decoupling capacitor C is connected for compensation.

Figure 7:
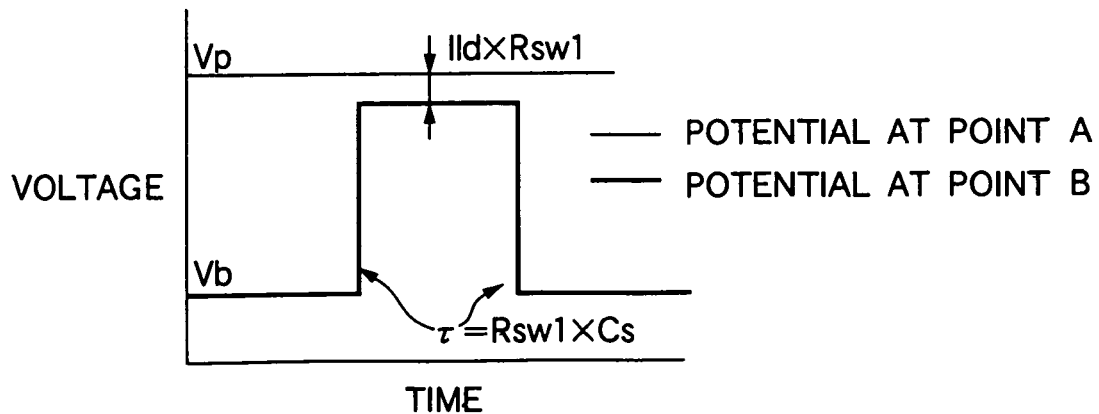
FIG. 7 shows an operation waveform of FIG. 5.

Thus, if a voltage source is connected, which is devised so that the output impedance (internal resistance) is disregarded beyond the entire frequency band, the potential at point B can be controlled to be fixed regardless of a load current. Therefore, as shown in FIG. 7, it is possible to prevent the drive voltage from fluctuating in line with ON/OFF of the switch SWd.

Also, since the decoupling capacitor C is connected to the output terminal of the voltage source whose voltage is stabilized by feedback, the output potential does not change in spite of presence of load, wherein it is possible to prevent overshoot from occurring when the laser is turned on. By setting the capacitance value of the decoupling capacitor C to a larger value than the capacitance value of the parasitic capacitance of the drive end of the surface emitting laser LD when being observed from the switch SWd, the decoupling capacitor is caused to hold a suppression effect for fluctuations in voltage.

Also, a time constant τ of rise of a drive pulse (voltage pulse) on turning-on of the laser is determined by a product that is obtained by multiplying resistance from the output terminal of the voltage source to the drive end of the surface emitting laser LD, that is, resistance of synthetic parallel resistance of the internal resistance Rsw1 of the switch SWd and the internal resistance R1d of the surface emitting laser LD in the equivalent circuit shown in FIG. 6 by the capacitance value of the parasitic capacitance Cs resulting from the switch IC and wires. Therefore, by setting at least the resistance from the output terminal of the voltage source to the drive end of the surface emitting laser LD to a smaller value than the differential resistance value (several hundreds of ohms (Ω)) of the surface emitting laser LD, it is possible to make small (short) the time constant τ of rise of the drive pulse in turning-on of the laser.

Herein, since the capacitance value of the parasitic capacitance Cs becomes several tens of pF or so by adding the capacitance value of the parasitic capacitance in a printed circuit board to the input and output capacitance of an IC, it is necessary to set the resistance to 100 Ω or less in order to secure the rise within 1 nsec. However, if a recent CMOS transistor is used as the switch, several tens of ohms (Ω) can be easily achieved as an ON resistance, wherein the resistance does not apply any hindrance to the modulation speed.

Further, in the art based on the present basic concept, such a construction is employed, in which a current flowing through the operational amplifier OP that constitutes the second voltage source 13 is set to a smaller value than the current flowing through the surface emitting laser LD. Therefore, even in a case of achieving high speed drive of a surface emitting laser having a number of light emitting parts, consumption power in individual operational amplifiers OP can be suppressed low, and lower consumption power can be accomplished in the entire driving apparatus, wherein integration of circuits can be easily facilitated.

Here, a current flowing through the operational amplifier OP indicates an average current flowing into the transistor that constitutes the final step of the operational amplifier OP. Also, by employing a circuit configuration by which negative feedback is provided in the operational amplifier OP in the second voltage source 13, the average current flowing into the transistor that constitutes the final stage of the operational amplifier OP is set to a smaller value than the current flowing through the surface emitting laser LD.

Embodiment 1

Figure 8:
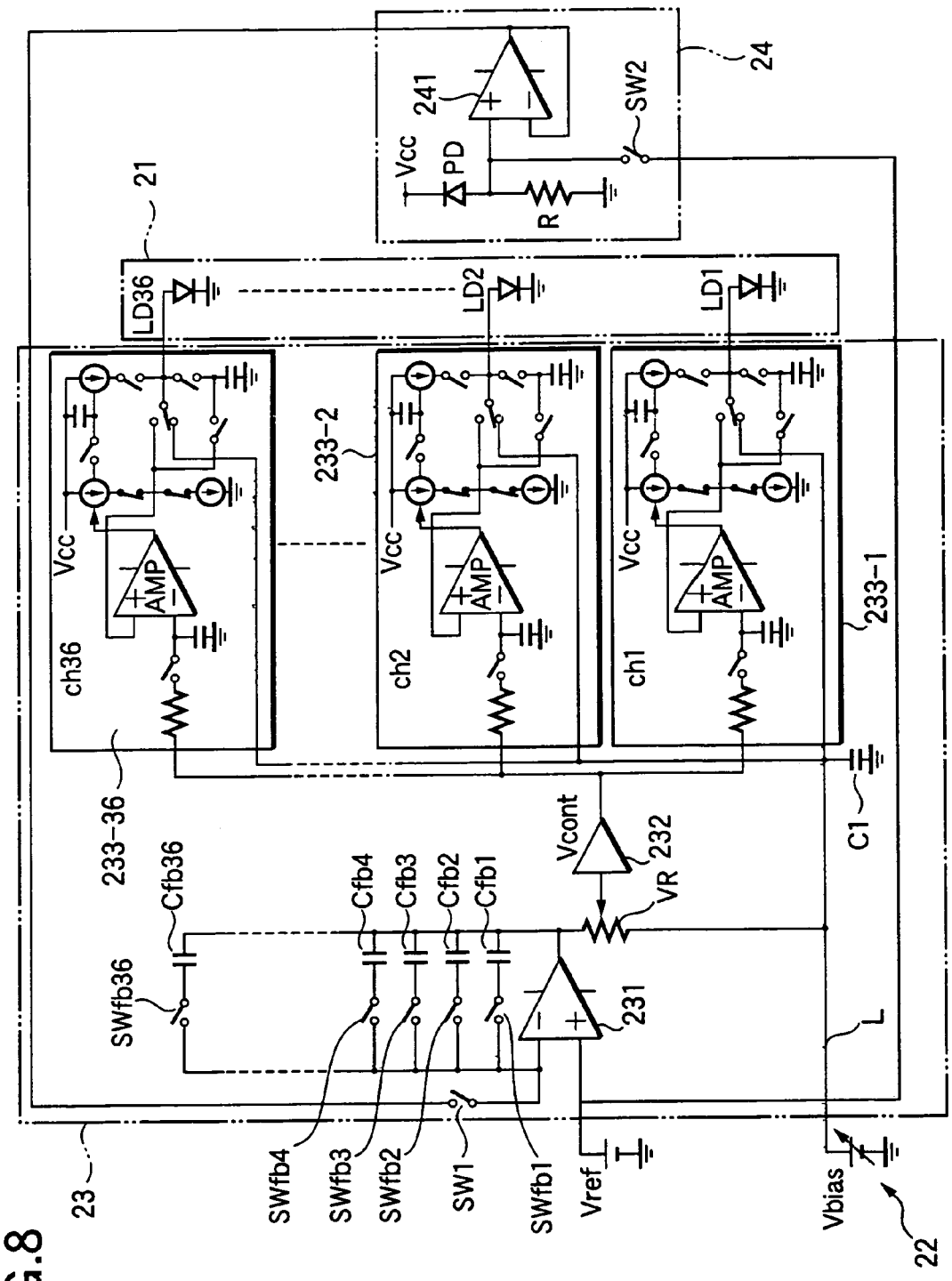
FIG. 8 is a circuit diagram showing a configurational example of a driving system using an apparatus for driving a surface emitting laser according to the first embodiment of the invention.

FIG. 8 is a circuit diagram showing a configurational example of a driving system using an apparatus for driving a light emitting element according to the first embodiment of the invention, for example, a surface emitting laser driving apparatus. In the present embodiment, a surface emitting laser 21 having, for example, thirty-six light emitting parts LD1 through LD36 is used as a light emitting element that is a subject to be driven.

The system for driving a surface emitting laser according to the embodiment includes a first voltage source 22 for generating a bias voltage Vbias, a second voltage source (variable voltage source) 23 for generating a drive voltage (control voltage), and an power detecting circuit 24 for detecting the power of the surface emitting laser 21. The first voltage source 22 and the second voltage source 23, respectively, correspond to the first voltage source 12 in FIG. 1 and the second voltage source 13 therein.

The bias voltage Vbias that is generated by the first voltage source 22 determines a voltage which is applied to the corresponding light emitting part LD when the light emitting part (laser) is turned off, and the same is established to as a high voltage as possible under the condition that the light emitting part LD does not emit, in order to raise the modulation speed. Normally, the bias voltage Vbias is set to a voltage which is slightly lower than the lowest threshold voltage of laser oscillation of a plurality of the light emitting parts, using the same as a reference.

The second voltage source 23 includes drive control circuits 233-1 through 233-36, switches SWfb1 through SWfb36 and capacitors Cfb1 through Cfb36 for 36 channels (ch) which are provided, corresponding to an amplifier 231, a variable resistance VR, a buffer 232, a switch SW1, and light emitting parts LD1 through LD36 of a surface emitting laser 21.

The amplifier 231 uses, as a non-inverting (+) input, the reference voltage Vref set to as to corresponding laser power that becomes a target and uses, as an inverting (−) input, a detection signal that is provided from the power detection circuit 24 to the switch SW1. The switches SWfb1 through SWfb36 and capacitor Cfb1 through Cfb36 are provided, corresponding to the light emitting parts LD1 through LD36 of the surface emitting laser 21, wherein these switches and capacitors are connected in series between the inverting input terminals and output terminals in order of the switch SWfb1 and capacitor Cfb1, switch SWfb2 and capacitor Cfb2, and the like.

The variable resistance VR is connected between the output terminal of the amplifier 231 and the bias line L to which the bias voltage Vbias is applied. A capacitor C1 is connected between the bias line L and the ground. And, the output voltage of the amplifier 231 is applied, as a control voltage Vcont, to the drive control circuits 233-1 through 233-36 through the buffer 232. Further, the bias voltage Vbias is commonly applied to the drive control circuits 233-1 through 233-36 through the bias line L.

Also, in this example, although it is assumed that the bias voltage Vbias is commonly applied to all the drive control circuits 233-1 through 233-36 to cover 36 channels (ch), in a case where there is large unevenness in the threshold voltages for laser oscillation among thirty-six light emitting parts of the surface emitting laser 21, it is possible that a plurality of bias voltages Vbias having different voltage values are prepared, and a bias voltage Vbias of a voltage value near the optimal value is applied to respective groups, in which those whose threshold values of laser oscillation are proximate to each other are classified group by group, in individual light emitting parts LD1 through LD36. Thereby, in comparison with providing bias voltages Vbias for 36 channels (ch), the unevenness in the threshold voltages of laser oscillation can be solved without making the circuit configuration complicated.

Figure 9:
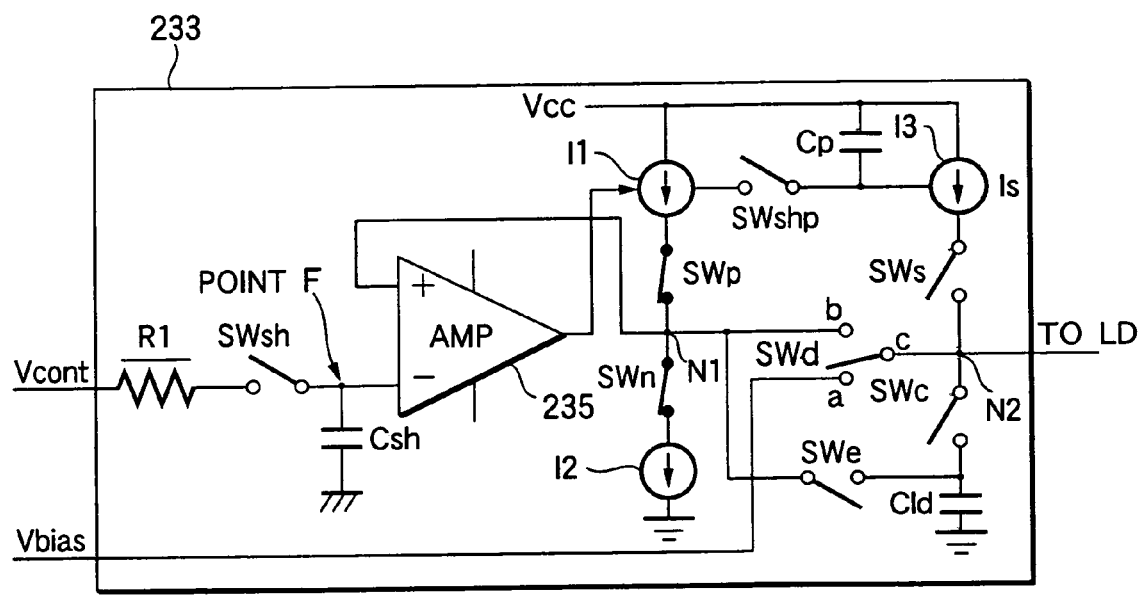
FIG. 9 is a circuit diagram showing a circuit configuration of a drive control circuit for one channel.

All the drive control circuits 233-1 through 233-36 for 36 channels are composed of the same circuit configuration. Therefore, as to a detailed circuit configuration thereof, a description is given thereof, using FIG. 9 showing an enlarged circuit configuration of a drive control circuit 233 for one channel. Also, the drive control circuits 233-1 through 233-36 are constructed so as to include the switches SW1 through SWn (n=36) in FIG. 1.

As has been made clear in FIG. 9, the drive control circuit 233 includes an amplifier 235, resistance R1, three capacitors Csh, Cp and Cld, eight switches SWsh, SWp, SWn, SWshp, Sws, SWd, SWc and Swe, and three current sources I1, I2, and I3.

A control voltage Vcont that is applied by the second voltage source 23 is applied to one end of the resistance R1. The input end of the switch SWsh is connected to the other end of the resistance R1, and the output end thereof is connected to an inverting (−) input terminal of the amplifier 235. The capacitor Csh is connected between the inverting input terminal of the amplifier 235 and the ground. The non-inverting (+) input terminal of the amplifier 235 is connected to node N1. Also, herein, although the switch SWsh is connected to the inverting input terminal side of the amplifier 235, it is possible to alter the connection sequence and connection pattern of switches and resistance in order to avoid switching noise that is generated by the switch SWsh and leak resulting from the switch SWsh and resistance R1.

The current source I1 and switch SWp are connected in series between the power source Vcc and node N1. The current Ip of the current source I1 is controlled by the output voltage of the amplifier 235. The switch SWn and current source I2 are connected in series between node N1 and the ground. The switch SWp and switch SWn are normally closed switches.

The current source I3 and switch SWs are connected in series between the power source Vcc and node N2 to which the anode of the light emitting part LD of the surface emitting laser 21 is connected. At the switch SWshp, one terminal thereof is connected to the output of the amplifier 235, and the other terminal thereof is connected to the current source I3. The capacitor Cp is connected between the power source Vcc and the other terminal of the switch SWshp. The current sources I1 through I3 are composed of, for example, current mirror circuits.

The switch SWc and capacitor (decoupling capacitor) Cld are connected in series between node N2 and the ground. At the switch SWd, one terminal end b thereof is connected to the node N1, and the output terminal c thereof is connected to the node N2, wherein a bias voltage Vbias from the first voltage source 21 is applied to the other input terminal a. The switch Swe is connected between the node N1 and a connection point between the capacitor Cld and the switch SWc.

Again referring to FIG. 8, the power detecting circuit 24 utilizes, for example, a photo diode PD as an optical detector that detects laser light emitted by the light emitting parts LD1 through LD36 of the corresponding surface emitting laser 21. The photo diode PD has the cathode thereof connected to power source Vcc. One end of the resistance R is connected to the anode of the photo diode PD while the other end of the resistance R is grounded. The non-inverting input terminal of the amplifier 24 is connected to the connection point between the anode of the photo diode PD and one end of the resistance R. The reference voltage Vref described above is applied to the non-inverting input terminal via the switch SW2. The amplifier 241 is constructed so that the non-inverting input terminal and the output terminal are connected to each other.

The power detecting circuit 24 thus constructed outputs a detection signal in response to the power by the photo diode PD detecting a laser light beam that is emitted by the light emitting parts LD1 through LD36 of the surface emitting laser 21. The detection signal of the power detecting circuit 24, that is, an output signal of the amplifier 241, is provided, via the switch SW1, into the non-inverting input terminal of the amplifier 231 at the second voltage source 23 described above. That is, by feeding the detection signal of the power detecting circuit 24 back to the drive control circuits 233-1 through 233-36 via the second voltage source 23, a feedback system that carries out automatic power control (hereinafter called "automatic power control") that controls respective laser power of the light emitting parts LD1 through LD36 of the surface emitting laser 21 so that the same becomes power which is regulated by the reference voltage Vref.

Figure 10:
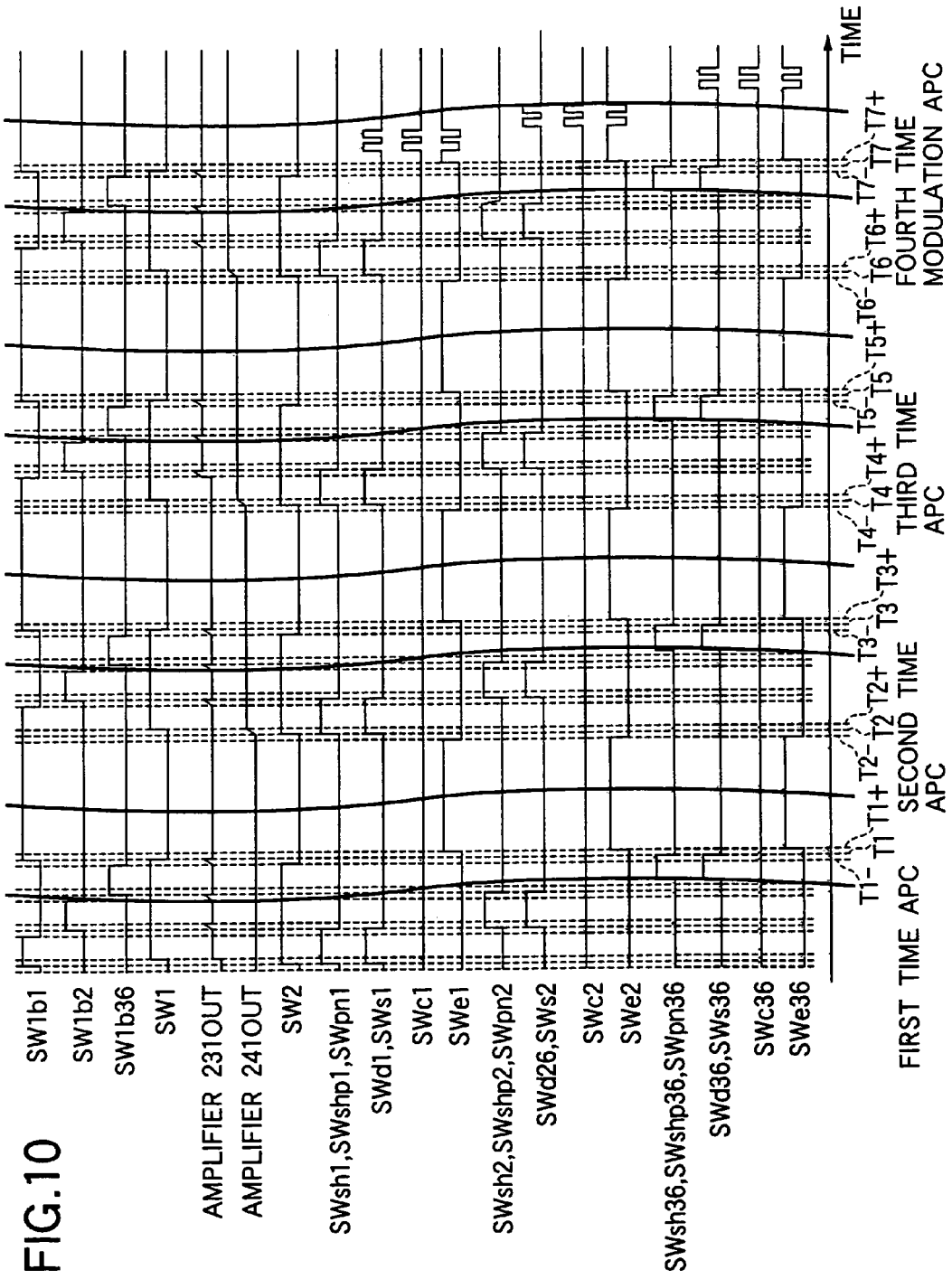
FIG. 10 shows a timing chart for explaining circuit operation of an apparatus for driving a surface emitting laser according to the first embodiment of the invention.

Next, a description is given of circuit operations of the surface emitting laser driving circuit according to the present embodiment thus constructed, with reference to FIG. 8 and FIG. 9. And, FIG. 10 shows a timing chart thereof. Also, in the timing chart shown in FIG. 10, a case is taken for instance, in which automatic power control is carried out by turns with respect to thirty-six light emitting parts LD1 through LD36 of the surface emitting laser 21 in one APC mode, and the process is executed four times, thereafter the mode shifts to a modulation mode. And, the description is given of the case.

Further, in the timing chart of FIG. 10, respective switching pulses that control ON and OFF of the switch SWfb and switch SW1 of the second voltage source 23, switches SWsh, SWp, SWn, SWshp, SWs, SWd, SWc and Swe of the drive control circuit 233, and switch of SW2 of the power detecting circuit 24 are composed of positive logic, and the same reference numbers as those of the respective switches are given to make the identification easy.

In the drive control circuit 233, a state illustrated, in which the switch SWd is connected to the terminal a side, is OFF, and a state in which the switch SWd is connected to the terminal b side is OFF. The switch SWc is turned on, so that the anode potential quickly becomes an appointed voltage, when the light emitting part LD of the surface emitting laser 21 is turned on. Further, by turning on the switch Swe when the light emitting part LD is turned off, the anode voltage effected when the light emitting part LD is turned on is charged into the decoupling capacitor Cld.

First, when the power source is turned on, at time T0−, switches SWfb1, switch SW1, switch SWsh, switch SWs, switch SWshp and switch SWd are turned on while switch SWp, switch SWn, switch SWc, and switch Swe are turned off. At this time, a current Is of the current source I3 is caused to flow into the light emitting part LD 1 via the switch SWs, whereby the light emitting part LD1 is turned on.

As the light emitting part LD1 is turned on, the photo diode PD of the power detecting circuit 24 receives the laser light, wherein a current responsive to the power is caused to flow into the photo diode PD. The current flowing through the photo diode PD is converted into voltage by resistance R, and is amplified by the amplifier 241. The same is outputted as a detection voltage responsive to the laser power of the light emitting part LD1.

The detection voltage is provided into the second reference voltage source 23 and is made into an inverting input of the amplifier (error amplifier) via the switch SW1. The amplifier 231 amplifies a difference (difference voltage) between the detection voltage and the reference voltage Vref and outputs the same. The output voltage of the amplifier 231 is obtained as a voltage in which a differential voltage with the bias voltage Vbias is divided by a variable resistor VR, and is provided into the drive control circuit 233-1 of ch1 via the buffer 232.

In the drive control circuit 233-1, that is, the drive control circuit 233 shown in FIG. 9, a control voltage Vcont that is inputted via the buffer 232 is provided into an amplifier (operational amplifier) 235 via resistance R1 and switch SWsh.

The amplifier 235 controls the laser power of the light emitting part LD1 by controlling the current Ip of the current voltage I1 in response to the input voltage. With the feedback control, finally, the detection voltage of the power detecting circuit 24 converges to become consistent with the reference voltage Vref. A series of the above control is the APC (automatic power control).

After that, if the switches SWfb1, SWshp and SWsh are turned off, the respective control voltages at this time are held in capacitors Cfb1, Cp and Csh, which are connected in series. At this time, the voltages that are held in the capacitors Cfb1, Cp and Csh respectively become an output voltage of the amplifier 231, a control voltage by which the drive current with respect to the light emitting part LD1 is established, and a terminal voltage of the light emitting part LD1, each being in ch1.

By continuously repeating the above-described operation equivalently to the number of the light emitting parts (36 parts in this example) of the surface emitting laser 21, all the control voltages of the drive control circuits 233-1 through 233-36 equivalent to 36 channels are held in 36 capacitors Cfb1 through Cfb36 that are connected between the inverting input terminal and output terminal of the amplifier 231. And, after the APC to cover 36 channels is completed, the switch SW1 is turned off, and at the same time, the switch SWfb1 is turned on, the control voltage in ch1 is made into the output voltage of the amplifier 231 as preparation for the next APC.

Also, till the next APC, the switch SW2 of the power detecting circuit 24 is turned on, and the output voltage of the amplifier 241 is set to the reference voltage Vref in the period of modulation, whereby it is possible to shorten the time necessary for the detection output of the photo diode PD to become constant when the next APC is commenced. As a result, since negative feedback controlled is carried out from the final voltage of the previous power control in respective nodes when the next APC is commenced, it is not necessary to converge the voltage to the final voltage with one-time control. Particularly, this is important in laser xerography in which a polygon mirror is employed in an optical scanning system that scans in the main scanning direction with a laser light beam, wherein unnecessary exposure of a photoconductor can be prevented by carrying out intermittent control from occurring, and it is possible to suppress deterioration of the photoconductor.

In the second voltage source 23, a variable resistor VR whose one end is connected to the output terminal of the amplifier 231 is provided to adjust the gain of the negative feedback, and the resistance ratio thereof, that is, a division ratio of the differential voltage between the output voltage of the amplifier 231 and the bias voltage thereof is established so that the stability and accuracy of the negative feedback loop are compatible with each other.

Also, although the other end of the variable resistor VR is connected to a bias line L of the bias voltage Vbias, this is a countermeasure for the terminal voltage of the light emitting part LD is controlled at more than the threshold voltage of laser oscillation. Thereby, uncontrollability that occurs since the voltage to be provided into the buffer 232 becomes lower than the threshold voltage of laser oscillation can be prevented even if the gain of the negative feedback loop is made small. Also, although the bias voltage Vbias is applied to the other end of the variable resistor VR herein, it may be acceptable that another source is provided and an appointed source voltage is provided from the corresponding source, whereby it becomes possible to more accurately control the terminal voltage.

In the drive control circuit 233 shown in FIG. 9, the capacitor (decoupling capacitor) Cld is devised so that the terminal voltage of the light emitting part LD quickly becomes the inherent drive voltage by turning on the switch SWc at the moment when a current flows into the light emitting part LD after the switch SWd is turned on. However, since the capacitance value of the capacitor Cld has a limitation, the terminal voltage will be lowered sooner or later with only the capacitor Cld, thereby causing the laser power to decrease. To compensate the decrease in laser power, the amplifier 235 that has been negative fed back is connected thereto via the switch SWd. Therefore, the capacitance value of the capacitor Cld is determined on the basis of a response speed of the amplifier 235.

Normally, if a CMOS operational amplifier is used as the amplifier 235 since 1 μsecond or so is required to response in the CMOS operational amplifier, the capacitance is set so that a degree for the terminal voltage of the capacitor Cld to drop in 1 μsecond becomes a permissible fluctuation. In detail, if the drive current of the surface emitting laser 21 is 1 mA, the fluctuation in voltage becomes $1/C \times 1$ mA$\times 1$ μsecond$=1/C \times 10^{-9}$.

Where it is assumed that the permissible power fluctuation is 2%, the internal resistance of the surface emitting laser 21 is 500 Ω, and a fluctuation in voltage with respect to the permissible fluctuation in power is 10 mV, it is necessary that the capacitance C of the capacitor Cld is 0.1 μF. However, the value is excessive if an attempt is made to accommodate the entire driving apparatus in a one-chip IC. Also, even if such a capacitor could be achieved by connecting the capacitor to, for example, the outside of an IC chip, since the output potential of the amplifier 235, that is, the internal control potential is changed due to a fluctuation in load, the terminal voltage of the light emitting part LD may fluctuate at the moment when the switch SWd is turned on. And, the voltage source output becomes unstable although being 2% until the negative feedback converges.

As the countermeasure, the switch SWs is turned on in synchronization with the switch SWd, and the laser drive current, that is, the current Is of the current voltage I3 is caused to flow into the drive end (anode) of the light emitting part LD as a compensation current. Thus, since a fluctuation in the output current from the amplifier 235, that is, a fluctuation in the output current of the voltage source can be suppressed to be low in spite of a state of the switch SWd, it is possible to prevent an excessive fluctuation in voltage of the voltage source from occurring due to a fluctuation in load when the switch SWd is turned on. Still further, if so, the time required for the capacitor Cld to hold the terminal voltage of the light emitting part LD becomes time until the current source I3 causes a current flow into the drive end of the light emitting part LD.

Figure 11:
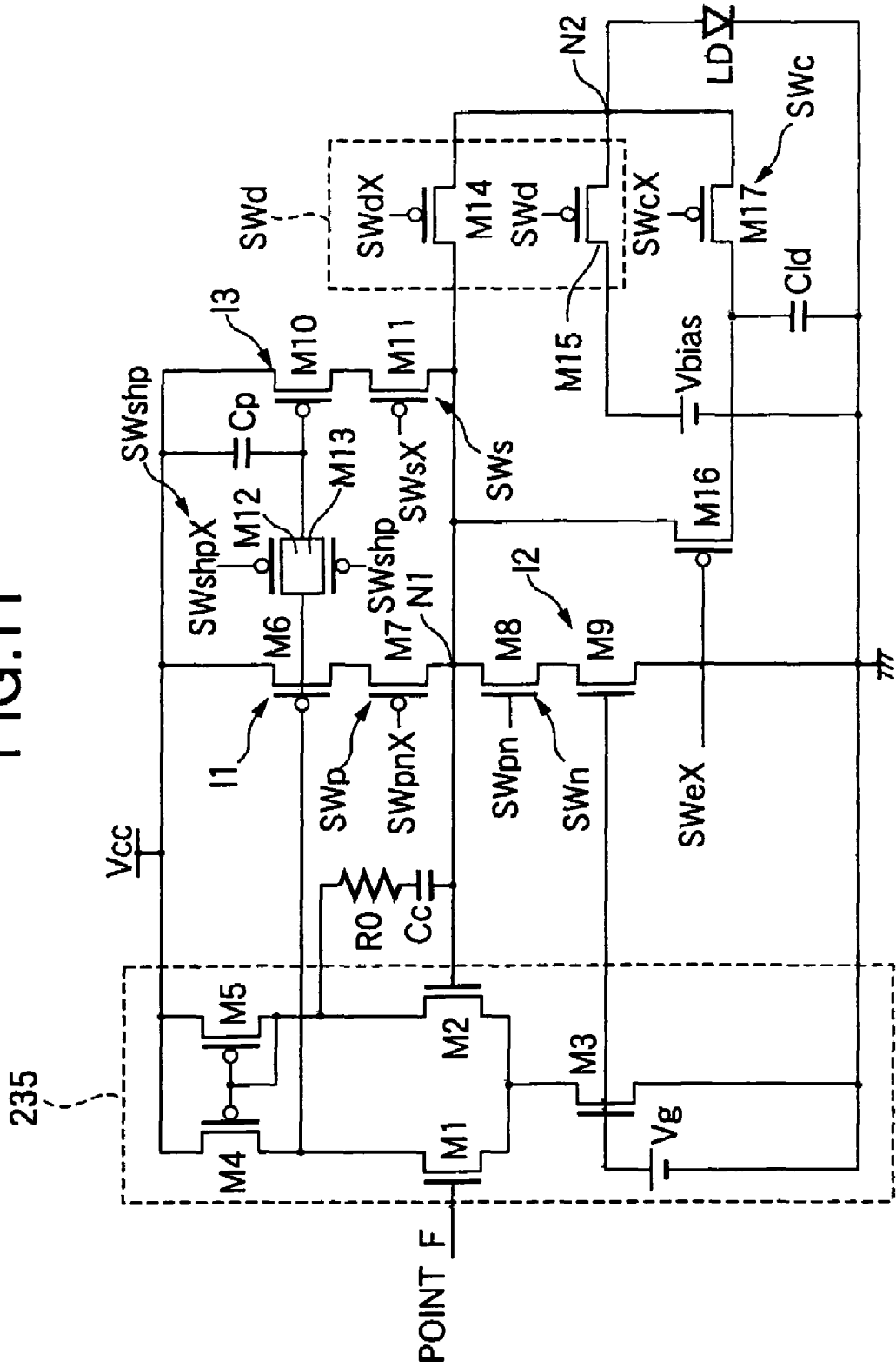
FIG. 11 is a circuit diagram showing an example of a specific circuit configuration of the drive control circuit for one channel.

In a case where the current source I3 is composed of a MOS transistor M10 in FIG. 11, since the response thereof is remarkably faster than the response of an operational amplifier, load onto the capacitor Cld is accordingly made small. As a result, it becomes possible to make the capacitance value of the capacitor Cld small. Also, since the laser drive current is provided from the current source I3, it becomes possible that a fluctuation in voltage due to ON resistance of the switches SWd and SWc is decreased to a level that may be neglected. Since the capacitance of the capacitor Cld required herein may be sufficient if the same can charge parasitic capacitance that is connected to the laser terminal, the capacitance becomes greater by 100 times through 1000 times than the parasitic capacitance.

Also, in the timing chart in FIG. 10, if time T1 is taken for instance, two times T1− and T1+ are indicated, the phase of which slightly slips forward and backward from the time T1. These times T1− and T1+ express timing with respect to actions that are not desired to overlap, in an S/H (sample hold) circuit, etc., in view of circuit actions with respect to those at the time T1 that becomes the reference action timing.

FIG. 11 is a circuit diagram showing a detailed circuit configuration of the drive control circuit 233 shown in FIG. 9, and the drawing shows a case where the amplifier 235, switches SWsh, SWp, SWn, SWshp, SWs, SWd, SWc and Swe are expressed in terms of MOS transistors. Also, switch SWsh, resistance R1 and capacitor Csh in the drive control circuit 233 shown in FIG. 9 are omitted herein. Further, parts which are similar to those in FIG. 9 are given the same reference numbers in FIG. 11.

In FIG. 11, the amplifier 235 is composed of a differential amplifier being a normal operational amplifier consisting of NchMOS transistors M1 and M2, constituting a differential pair, to which a source is connected, a NchMOS transistor M3 that is connected between the common connection point of the source and the ground, and PchMOS transistors M4 and M5 that are connected between the respective drains of the differential pair transistors M1 and M2 and a power source Vcc.

In the amplifier 235 thus constructed, a control voltage Vcont is applied to the gate of the MOS transistor M1 via resistance R1 and a switch SWsh, and a potential of the node N1 is applied to the gate of the MOS transistor M2. The MOS transistor M3 constitutes a constant current circuit by the gate thereof being biased by a constant voltage Vg. The MOS transistors M4 and M5 are active loads, and constitute a current mirror circuit by the respective gates thereof being commonly connected to each other, and the gate of the transistor M5 being commonly connected to the drain thereof.

PchMOS transistors M6 and M7 are connected in series between the source Vcc and the node N1. The MOS transistor M6 constitutes a current source I1, and the drain output of the MOS transistor M1 in the amplifier 235 is applied to the gate of the MOS transistor M6. The MOS transistor M7 constitutes a switch SWp, and a switching pulse SWpnX in which the switching pulse SWpn is inverted is applied to the gate thereof as shown in FIG. 10.

NchMOS transistors M8 and M9 are connected in series between the node N1 and the ground. The MOS transistor M8 constitutes a switch SWn, and the switching pulse SWpn shown in FIG. 10 is applied to the gate thereof. The MOS transistor M9 constitutes a current source I2, and a constant bias voltage Vg is applied to the gate thereof. These transistors M6 through M9 are made into operational amplifiers that constitute two stages of operational amplifiers along with the amplifier 235 described above.

PchMOS transistors M10 and M11 are further connected in series between the source Vcc and the node N1. The MOS transistor M10 constitutes the current source I3. The MOS transistor M11 constitutes a switch SWs, and a switching pulse SWsX in which the switching pulse SWs shown in FIG. 10 is inverted is applied to the gate thereof. A capacitor Cp is connected between the gate of the MOS transistor M10 and the source Vcc.

A PMOS transistor M12 and an NMOS transistor M13 are connected in parallel to each other between the respective gates of the MOS transistors M6 and M10. These MOS transistors M12 and M13 constitute a transfer gate. A switching pulse SWshpX in which the switching pulse SWshp shown in FIG. 10 is inverted is applied to the gate of the MOS transistor M12, and the switching pulse SWshp shown in FIG. 10 is applied to the gate of the MOS transistor M13.

Herein, the control voltage applied to the gate of the MOS transistor M6 is also applied to the gate of the MOS transistor M10 via the CMOS transfer gates (M12 and M13). When carrying out APC (Automatic Power Control), the light emitting part LD of the surface emitting laser 21 is driven by the MOS transistor M10. At this time, the control voltage is held in the capacitor Cp. In addition, it is desirable that the MOS transistors M10 and M11 are composed of dual gate MOS transistors, whereby since the parasitic capacitance of the source-drain at the connection point of both transistors M10 and M11 can be minimized, it is possible to quicken a rise speed (response speed) of the current source 13 which is composed of the transistor M10.

A PchMOS transistor M14 is connected between the node N1 and the node N2, and a Pch transistor M15 is connected between the Vbias source and the node N2. The MOS transistors M14 and M15 constitute a switch SWd. A switching pulse SWdX in which the switching pulse SWd shown in FIG. 10 is inverted is applied to the gate of the MOS transistor M14, and the switching pulse SWd is applied to the gate of the MOS transistor M15.

PchMOS transistors M16 and M17 are further connected in series between the node N1 and the node N2. The MOS transistor M16 constitutes a switch Swe, and a switching pulse SweX in which the switching pulse Swe shown in FIG. 10 is applied to the gate. The MOS transistor M17 constitutes a switch SWc, and a switching pulse SWcX in which the switching pulse SWc shown in FIG. 10 is inverted is applied to the gate thereof.

A capacitor Cld is connected between the drain (the source of the MOS transistor M17) of the MOS transistor M16 and the ground. Herein, since the current source I3 is remarkably fast in comparison with the voltage source brought about by an operational amplifier, contribution to suppression of a fluctuation in voltage by the capacitor Cld is made low. Therefore, it is possible to make the capacitance value of the capacitor Cld small. Also, the Vbias source corresponds to the first voltage source 22, shown in FIG. 8, to generate the bias voltage Vbias.

Resistance R0 and a capacitor Cc are connected in series between the drain of the MOS transistor M2 and the gate (node N1) of the MOS transistor M2 in the amplifier 235. The resistance R0 is provided to prevent oscillations due to a capacitance load, depending on the operational amplifier, that is, construction of the amplifier 235. Also, the capacitor Cc is a capacitor for compensating the phase.

Herein, it is necessary that the potential of the node N1 is negatively fed back to the input side of the operational amplifier, and the impedance of the node N1 is made so small as can be neglected. The existing technologies for devising the construction of the operational amplifiers and connecting capacitance loads without any oscillation are included therein.

Also, in the surface emitting laser driving apparatus according to the present embodiment, the anode of the light emitting part LD of the surface emitting laser 21 is made into a drive end, wherein the plane emitting laser 21 is driven by causing a current to flow into the drive end through the anode. Therefore, in the drive control circuit 233 thus constructed, since it is necessary to employ a construction of such a type (so-called source) as can sweep out a current to the anode of the light emitting part LD as a current source, the current source of the amplifier 235 is composed of an NchMOS transistor M3, and the active loads are composed of PchMOS transistors M4 and M5, respectively.

Figure 12:
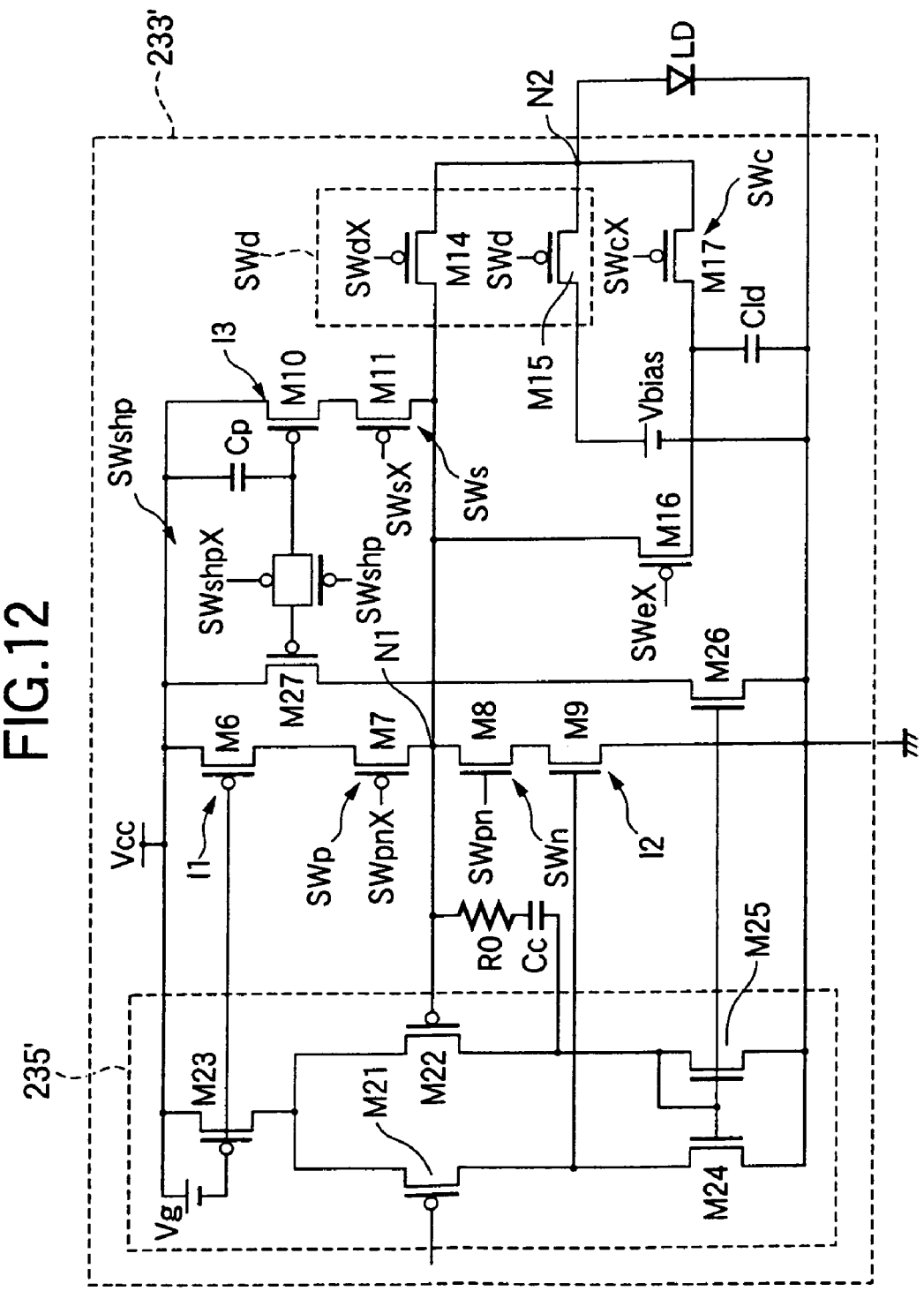
FIG. 12 is a circuit diagram showing a modified example of the specific circuit configuration of the drive control circuit for one channel.

However, the present embodiment is not limited to the above-described construction. By employing inverted types of MOS transistors that constitute the amplifier 235 and inverting the orientation of a current by using a current mirror circuit, it is possible to constitute a current source of such a type can sweep out a current to the anode of the light emitting part LD. FIG. 12 shows a circuit configuration of a drive control circuit 233' according to the above-described modifier version of the embodiment.

In the amplifier 235 of the drive control circuit 233 according to the preceding embodiment, the differential amplifier is composed of NchMOS transistors M1 and M2, the constant current circuit is composed of a NchMOS transistor M3, and the current mirror circuit is composed of PchMOS transistors M4 and M5. However, in the amplifier 235' of the drive control circuit 233' according to the present modified version, the differential amplifier is composed of PchMOS transistors M21 and M22, the constant current circuit is composed is a PchMOS transistor M23, and the current mirror circuit is composed of NchMOS transistors M24 and M25, respectively.

The gate of a NchMOS transistor M26 is further connected to the respective gates of the MOS transistors M24 and M25. The MOS transistor M26 constitutes a current mirror circuit along with the MOS transistors M24 and M25. The current mirror circuit picks up a current by inverting the orientation of the current flowing through the amplifier 235'. The current is converted into a voltage by a PchMOS transistor M27 of a diode connection in which the gate and drain are connected to each other, and is applied to the gate of the PchMOS transistor M10 as a control voltage.

As described above, in the surface emitting driving apparatus according to the first embodiment, it is noted that the surface emitting laser that emits light in a single mode has large internal resistance (which is lager by one digit than that of the edge emitting laser), wherein since no resistance component that becomes a cause of suppressing the modulation speed between the output end and the drive end by substantially directly driving the drive end (in the example, the anode) of the surface emitting laser in terms of voltage, the modulation speed can be accelerated.

And, for example, in the field of laser xerography, if a surface emitting laser that emits a number of laser light beams is used as the laser light source, and the surface emitting laser is driven with a voltage source of smaller output impedance than a differential resistance value (several hundreds of ohms ($\Omega$)) of the surface emitting laser using a driving apparatus according to the present embodiment, these greatly contribute to heightening the resolution power and speed.

Figure 13:
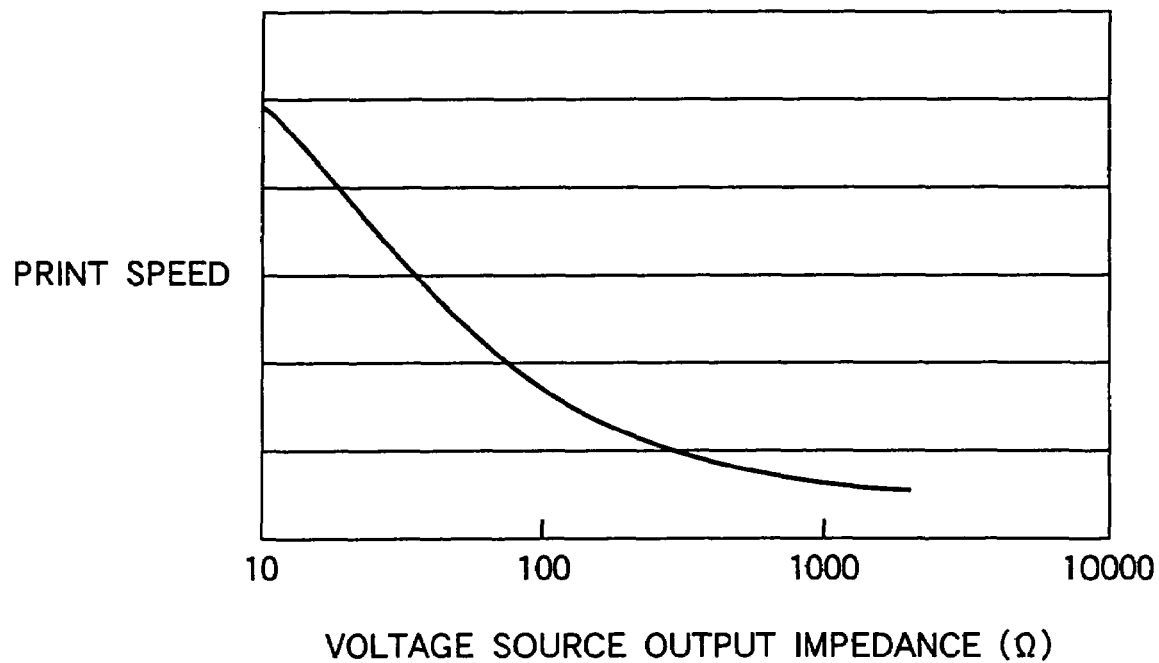
FIG. 13 shows the dependency of voltage source output impedance of a printing speed where it is assumed that the specifications are 2400 dpi, 256 gray-scales, and 36 beams.

FIG. 13 shows the dependency of voltage source output impedance of a printing speed where it is assumed, as one example, that the specifications are 2400 dpi, 256 gray-scales, and 36 beams. As has been made clear in the same drawing, as the voltage source output impedance becomes smaller than several hundreds of ohms ($\Omega$), it is found that the printing speed can be increased, and a remarkably high printing speed can be obtained at 10 $\Omega$ or so.

Figure 14:
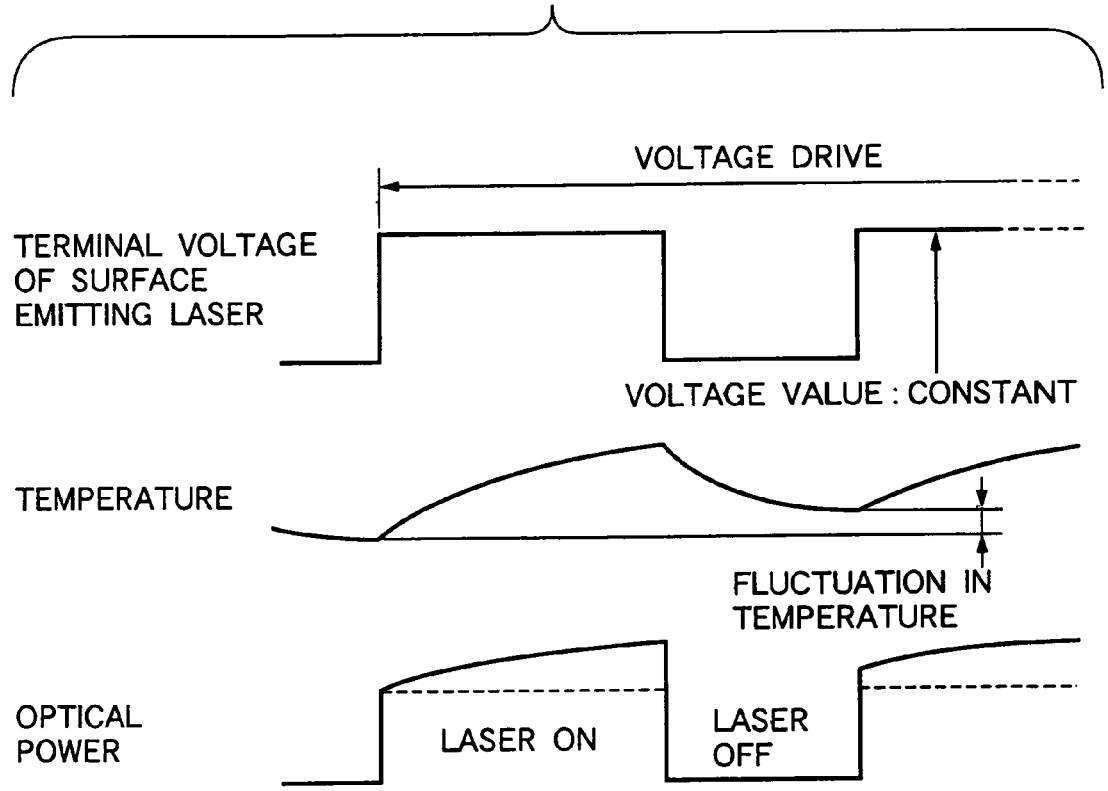
FIG. 14 is a timing wave form diagram showing wave form of each part in a case of the voltage drive.

However, where voltage drive is continued by application of voltage onto the surface emitting laser, as shown in the waveform diagram of FIG. 14, the current flowing through the surface emitting laser is increased as time elapses after the voltage is applied, and the optical power (the amount of light) of the surface emitting laser depends on the flowing current. Therefore, the power is increased as time elapses. That is, the drive current is increased by continuously applying a voltage when the terminal voltage to provide the same power is lowered in line with an increase in the temperature of the laser element after the voltage is applied, and the power of the laser element is resultantly increased. The fluctuation in the power becomes factor of lowering the quality in an image to be formed. The second embodiment which will be described below provides a light emitting element in which voltage drive and current drive are concurrently employed in view of this point.

Embodiment 2

Figure 15:
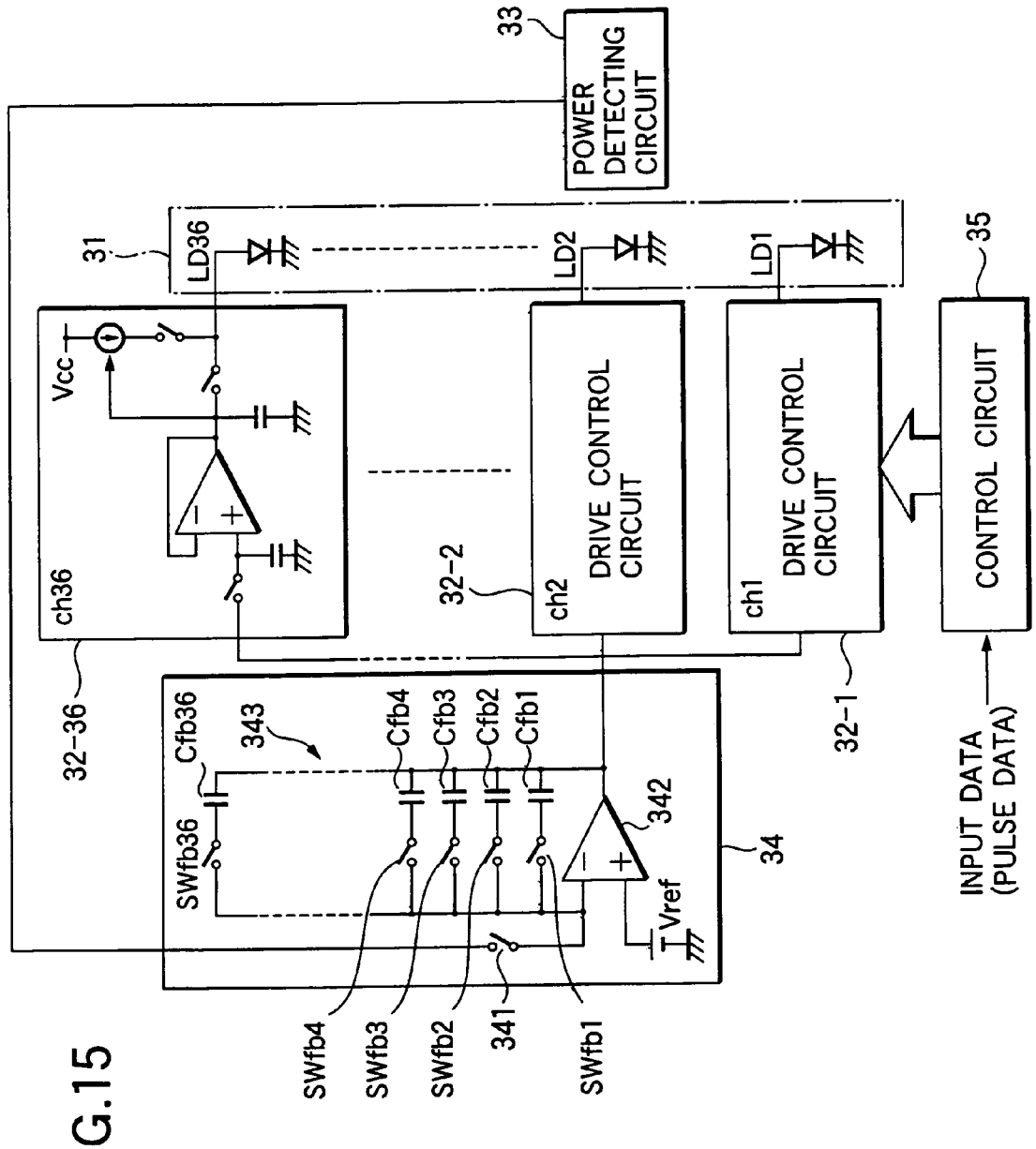
FIG. 15 is a circuit diagram showing a configurational example of a driving system using an apparatus for driving a surface emitting laser according to the second embodiment of the invention.

FIG. 15 is a circuit diagram showing a configurational example of an apparatus for driving a light emitting element according to the second embodiment of the present invention, a driving system in which, for example, a surface emitting laser driving apparatus is employed. In the present embodiment, a light emitting element, in which a surface emitting laser 31 having for example, 36 light emitting parts LD1 through LD36 is a subject to be driven, is used.

In FIG. 15, a surface emitting laser driving system according to the present embodiment includes drive control circuits 32-1 through 32-36 to cover 36 channels, which are provided to correspond to respective light emitting parts LD1 through LD36 of the surface emitting laser 36; a power detecting circuit 33 for detecting the power of the surface emitting laser 31; a difference amplifying circuit 34 that constitutes a feedback system for feeding detection results of the power detecting circuit 33 back to the drive controlling circuits 32-1 through 32-36; and a control circuit 35 for controlling the drive control circuits 32-1 through 32-36.

All the drive control circuits for 36 channels are configured by the same circuits. That is, the drive control circuits 32 (32-1 through 32-36), respectively, have voltage driving means at the front stage and current driving means at the rear stage as the principle thereof is shown in FIG. 15. In the same drawing, a buffer amplifier is shown as a typical example of the voltage driving means, and the buffer amplifier includes a negative feedback loop from the output terminal to the inverting input terminal, a capacitor acting as input side holding means for holding a control voltage, when controlling the power (that is, carrying out APC), at the input side of the non-inverting input terminal, and a capacitor acting as output side holding means for holding the output voltage at the output side thereof.

Also, a constant current source that applies a control voltage corresponding to an output of the voltage driving means is shown as the current driving means. In the constant current source, a feeding current is controlled in response to the control voltage. For example, where the constant current source is composed of FET, the control is achieved by controlling the gate voltage of the FET.

In FIG. 15, voltage drive which is brought about by the voltage driving means and current drive which is brought about by the current driving means are changed over in the principle on the basis of input data by switching means that is provided between the respective outputs of the voltage driving means and current driving means and the laser elements LD acting as light emitting elements.

Figure 16:
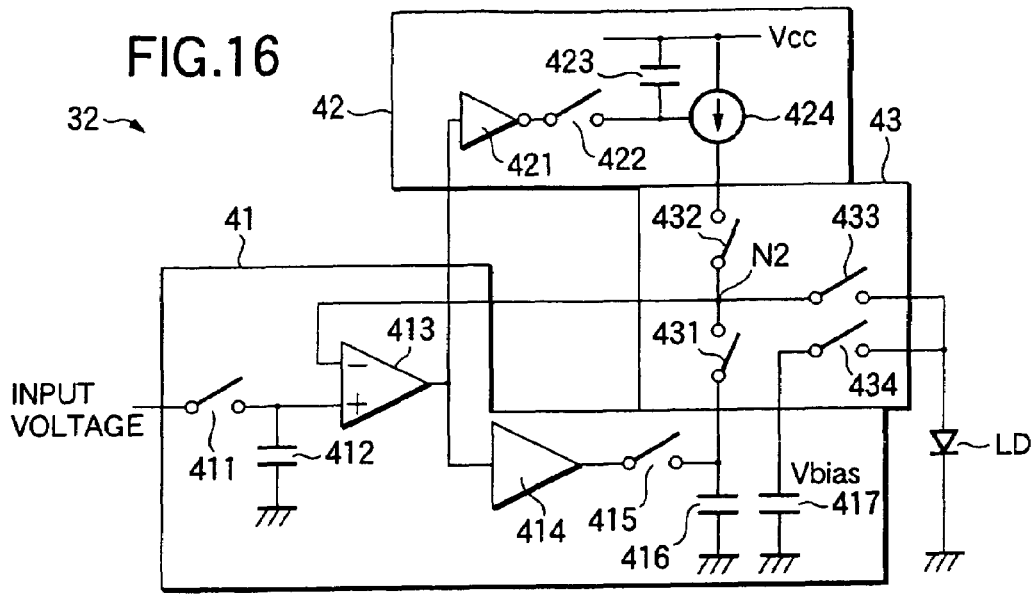
FIG. 16 is a circuit diagram showing a circuit configuration of a drive control circuit for one channel.

Next, a description is given of a detailed circuit configuration of a drive control circuit 32 for 1 channel, using the more practical circuit diagram of FIG. 16 than in FIG. 15, which is substantially identical to FIG. 9 but has differences in expression.

As has been made clear in FIG. 16, the drive control circuit 32 includes a voltage drive circuit 41 that drives the light emitting part LD of a surface emitting laser 31 in terms of voltage; a current drive circuit 42 that drives the light emitting part LD of the surface emitting laser 31 in terms of current;

and a switching circuit 43 for changing over the voltage drive which is brought about by the voltage drive circuit 41, and current drive which is brought about by the current drive circuit 42. Herein, the switching circuit 43 constitutes changing means for changing over the voltage drive which is brought about by the voltage drive circuit 41, and current drive which is brought about by the current drive circuit 42, along with the control circuit 35 (See FIG. 15) for controlling ON/OFF of the corresponding switching circuit 43.

The voltage drive circuit 41 includes a switch 411 that selectively picks up a voltage corresponding to the voltage for controlling the power (when carrying out APC), that is, an output voltage of the difference amplifying circuit 34 (See FIG. 15); a capacitor 412 for holding the voltage picked by the switch 411; an operational amplifier 413 in which the voltage held by the capacitor 412 is made into a non-inverting (+) input; a buffer 414 for buffering the output voltage of the operational amplifier 413; a switch 415 for selectively outputting the output voltage of the buffer 414; a capacitor 416 for holding the output voltage of the switch 415; and a bias voltage source 417 for generating a bias voltage Vbias.

The voltage drive circuit 41 is constructed so that the output voltage of the corresponding voltage drive circuit 41, that is, the voltage held by the capacitor 416 is negatively fed back to the operational amplifier 413 via the switching circuit 43 as the inverting (−) input. Also, the output voltage of the voltage drive circuit 41 is set to a voltage value that is larger than and including the threshold voltage of laser oscillation with the light emitting part LD of the surface emitting laser 31 established in a forward-biased state. Also, the bias voltage Vbias is set to a voltage value that is lower than the threshold voltage of laser oscillation with the light emitting part LD of the surface emitting laser 31 established in a forward-biased state.

The current drive circuit 42 includes an inverter 421 for inverting the output voltage of the operational amplifier 413; a switch 422 for selecting picking up the output voltage of the inverter 421; a capacitor 423 for holding the voltage picked up by the switch 422; and a constant current source 424 for outputting a current corresponding to the voltage held by the capacitor 423.

The switching circuit 43 includes a switch 431 that is connected between the output end of the voltage drive circuit 41, that is, the output end of the capacitor 416, and the node N2; a switch 432 that is connected between the output end of the current drive circuit 423, that is, the output end of the constant current source 424, and the node N2; a switch 433 that is connected between the node N2 and the drive end of the light emitting part LD of the surface emitting laser 31; and a switch 434 that is connected between the drive end of the light emitting part LD and the output end of the bias voltage source 417. Herein, the voltage held by the capacitor 416 of the voltage drive circuit 41 is negatively fed back to the operational amplifier 413 via the switch 431.

In the drive control circuit thus constructed, the switches 411 and 415 of the voltage drive circuit 41, the switch 422 of the current drive circuit 42, and the switches 431 through 434 of the switch circuit are controlled to be turned on and off by the control circuit 35 shown in FIG. 15 on the basis of input data which are pulse data.

In addition, the drive control circuit 32 is constructed so as to become basically identical to the construction of the drive control circuit 233 (See FIG. 9) in the first embodiment. That is, in comparison between FIG. 16 and FIG. 9, the voltage drive circuit 41 in FIG. 16 corresponds to the amplifier 235 in FIG. 9 and the surrounding circuits thereof, and the current drive circuit in FIG. 16 corresponds to the current source 13 in FIG. 9 and the surrounding circuits thereof. Furthermore, the switch circuit 43 in FIG. 16 corresponds to the switches SWc, SWd, and SWs in FIG. 9.

In FIG. 16, the constant current source 424 is that in which the PMOS transistor is symbolized, and the control voltage corresponds to the gate voltage of the PMOS transistor. Therefore, the current is decreased if the control voltage is raised, and the same is increased if the control voltage is lowered. Thus, since fluctuations in the current with respect to the control voltage becomes inverse of the current source in which an NMOS transistors are used, in the same drawing, an attempt is made to invert the control voltage by using the inverter (inverting amplifier) 421.

In FIG. 9, since the current source I1 is controlled by an output of the amplifier 235 without inverting the same, the voltage at the node N1 is inputted into the non-inverting input side when being fed back to the amplifier 235. To the contrary, in FIG. 16, since the inverter 421 is inserted, the potential of the node N2 is fed back to the inverting input side of the error amplifier 413. However, in either of FIG. 9 r FIG. 16, the two circuits are identical to each other with respect to the point at which negative feedback is effected.

Again returning to FIG. 15, the difference amplification circuit 34 includes a switch 341 which is turned on when controlling the power (that is, carrying out APC); an error amplifier 342 in which a reference voltage Vref set corresponding to target laser power is made into a non-inverting (+) input, and a detection signal provided from the power detecting circuit 33 via the switch 341 is made into an inverting (−) input; and a negative feedback loop 343 that negatively feeds the output of the error amplifier 342 back to the corresponding error amplifier 342 as the inverting input thereof.

The negative feedback loop 343 includes capacitors Cfb1 through Cfb36 for holding voltage corresponding to the output voltage of the error amplifier 342 when carrying out APC of the surface emitting laser 31; and switches SWfb1 through SWfb36, which are connected to these capacitors Cfb1 through Cfb36 in series, corresponding to the number of drive control circuits 32-1 through 32-36.

The power detecting circuit 33 employs, for example, a photo diode PD, as an optical detector for detecting laser light that is emitted from the light emitting parts LD1 through LD36 of the surface emitting laser 31. That which has the same circuit configuration as in the power detecting circuit 24 in the first embodiment may be used as the power detecting circuit 33.

Figure 17:
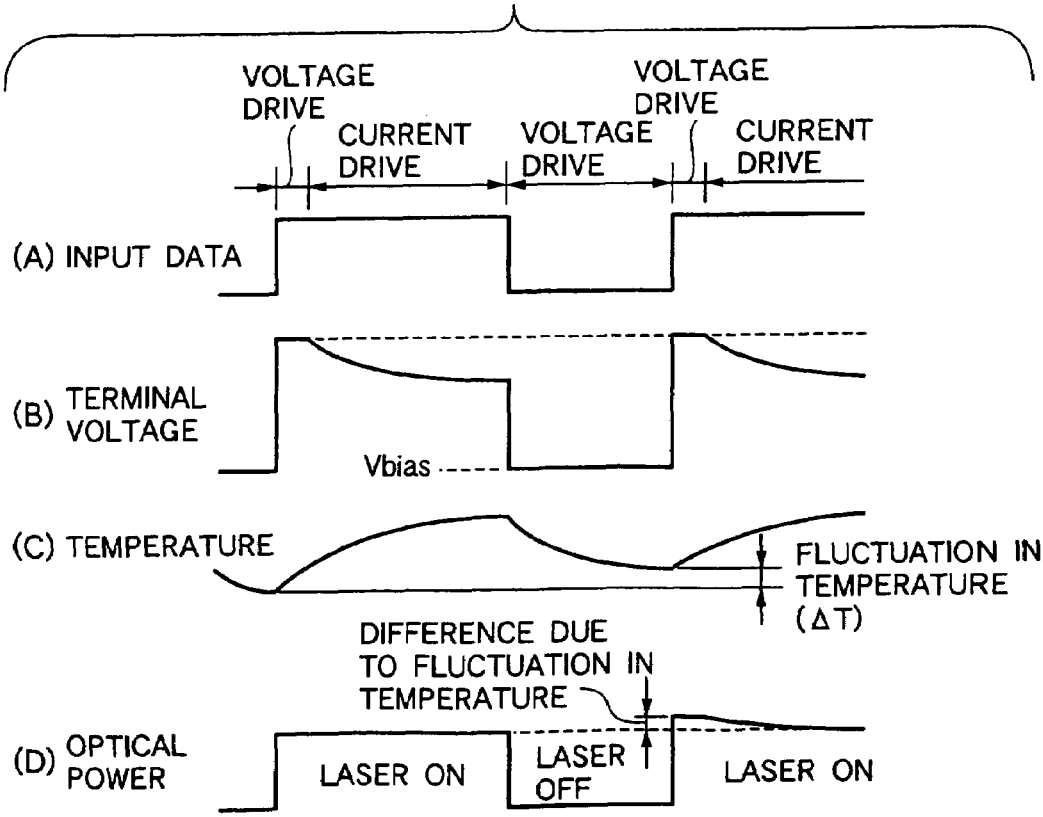
FIG. 17 shows a timing wave form for explaining operation of an apparatus for driving a surface emitting laser according to the second embodiment of the invention.

Next, a description is given of circuit operations of the drive control circuit 23 in a surface emitting laser driving system according to the second embodiment having the above-described construction, using views describing actions, shown in FIG. 18 through FIG. 21, corresponding to respective action modes based on a timing waveform view in FIG. 17. In the timing waveform view in FIG. 17, (A) indicates a waveform of input data (pulse data), (B) indicates a waveform of the terminal voltage of the surface emitting laser 31, (C) indicates a waveform of temperature of the surface emitting laser 31, and (D) indicates a waveform of power of the surface emitting laser 31.

Figure 18:
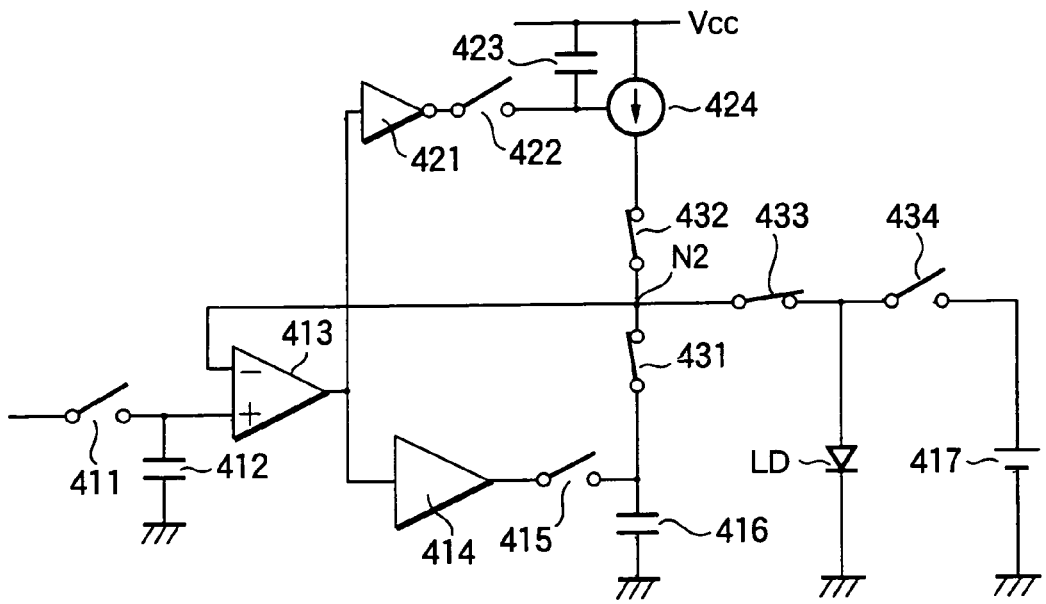
FIG. 18 is an equivalent circuit diagram in a case of voltage drive.

Actions of the drive control circuit 23 are controlled on the basis of input data under control of the control circuit 35. In the timing waveform chart of FIG. 17, in the period of rise of pulse data (A) which are input data, the control circuit 35 turns on the switches 431, 432, and 433 and turns off the switches 411, 415, 422, and 434 as shown in FIG. 18, wherein the voltage held by the capacitor 416 is applied to the light emitting part LD of the surface emitting laser 31 via the switches 431 and 433.

As a result, voltage drive is brought about by the voltage drive circuit 41 in the period of rise of the pulse data (A). In the case of driving a surface emitting laser that is able to emit a number of laser light beams, the voltage drive is more advantageous than the current drive as described the prior arts, wherein it is possible to drive the surface emitting laser 31 to emit light instantaneously in response to the rise of the pulse data (A). Also, the period of the voltage drive by the voltage drive circuit 41 is set to the minimum pulse width or less of the pulse data, whereby it is possible to securely drive the laser in response to the rise (or fall) of the pulse data with respect to those of any pulse width.

Also, in the period of rise of pulse data (A), the switch 432 is turned on at the same time when being changed to the voltage drive brought about by the voltage drive circuit 41, whereby current drive brought about by the current drive circuit 42 can be selected. Therefore, a current is outputted from the constant current source 424 in response to the voltage held by the capacitor 423, and the current is provided to the light emitting part LD of the surface emitting laser 31 via the switches 432 and 433. At this time, the current of the constant current source 424 is caused to flow into the light emitting part LD of the surface emitting laser 31 as a compensation current in the first embodiment.

Thus, by causing a current of the constant current source 424 to flow into the light emitting part LD of the surface emitting laser 31 as a compensation current when driving in terms of voltage in the period of rise of pulse data (A), a fluctuation in the output current of the operational amplifier 413 can be suppressed to be low regardless of a state of the switch 433. Therefore, it is possible to prevent a transient fluctuation in voltage due to fluctuation in load when the corresponding switch is turned on.

Light emitting drive of the surface emitting laser 31 is commenced, since a current is flowing into the light emitting part LD of the surface emitting laser 31, the surface emitting laser 31 is heated, and the temperature (C) of the surface emitting laser 31 rises as time elapses.

Figure 19:
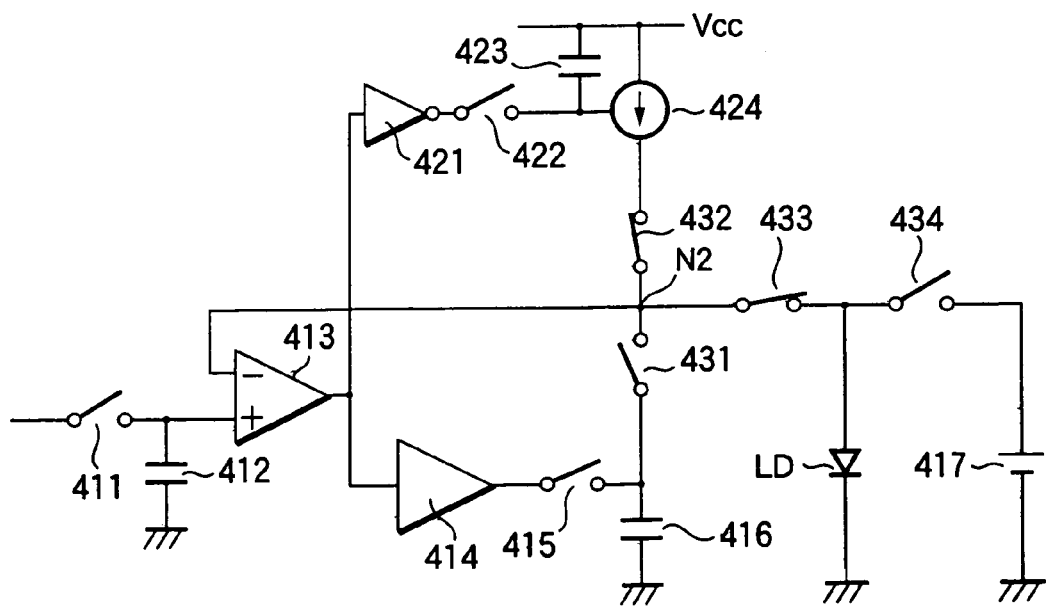
FIG. 19 is an equivalent circuit diagram in a case of current drive.

After the period of rise of pulse data (A), as shown in FIG. 19, the control circuit 35 turns on the switches 432 and 433 as shown in FIG. 19 and turns off the switches 411, 415, 422, 431, and 434, whereby the current outputted by the constant current source 424 in response to the voltage held by the capacitor 423 is provided into the light emitting part LD of the surface emitting laser 31 via the switch 432 and the switch 433. Resultantly, the current drive is brought about by the current drive circuit 42 after the rise of the pulse data (A).

With the current drive, a constant current outputted from the constant current source 424 is caused to flow into the light emitting part LD of the surface emitting laser 31. Thereby, the terminal voltage (B) of the surface emitting laser 31 gradually drops. At this time, since a constant current is flowing into the surface emitting laser 31 and the power (D) of the surface emitting laser 31 is determined by the current although the temperature (C) of the surface emitting laser 31 increases in line with elapse of time, it is possible to prevent fluctuations in the power (D) of the surface emitting laser 31 as in the case where voltage drive is continued after the rise of the pulse data (A).

Figure 20:
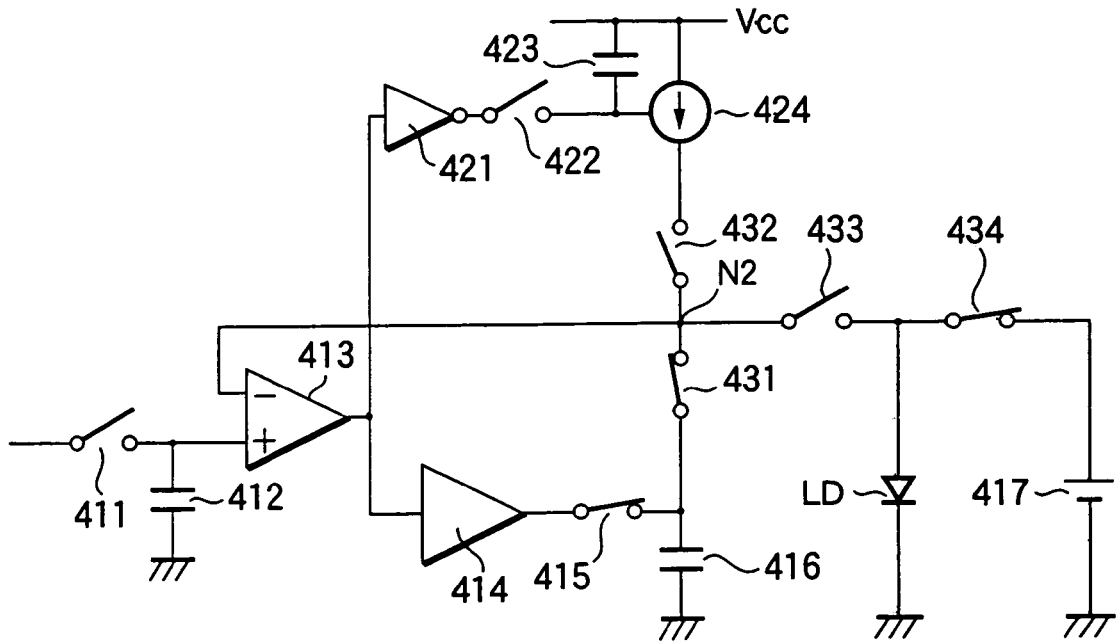
FIG. 20 shows an equivalent circuit diagram in a case of turning off laser.

Next, in the period of fall of pulse data (A), as shown in FIG. 20, the control circuit 35 turns on the switches 415, 431, an 434, and turns off 411, 422, 432 and 433. Thereby, a bias voltage Vbias emitted from the bias voltage source 417 is applied onto the light emitting part LD of the surface emitting laser 31 via the switch 434 (Voltage drive).

Thus, if the bias voltage Vbias, which is in a forward-biased state and lower than the threshold voltage of laser oscillation, is applied in advance when the laser is turned off, it is possible to suppress the amplitude of the application voltage in modulation to a low level. Therefore, quick shift to the modulation mode can be carried out. Also, if the bias voltage Vbias is continuously applied after the period of rise of pulse data (A), it is possible to suppress the amplitude of the application voltage to a low level in the next rise.

The aboves are respective circuit operations of the voltage drive mode, current drive mode and laser-turned off mode in the modulation period. However, before entering the modulation period, the circuit operations in the APC mode, in which the power of the surface emitting laser 31 is automatically controlled, is carried out.

Figure 21:
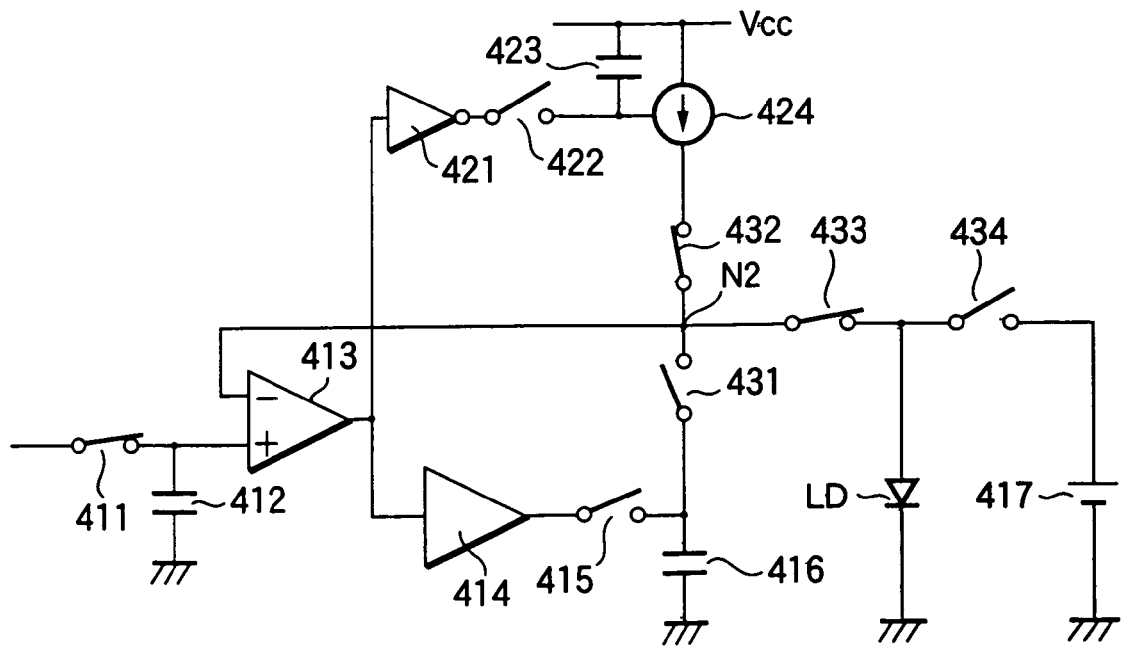
FIG. 21 shows an equivalent circuit diagram in a case of APC mode.

In the APC mode, as shown in FIG. 21, the control circuit 35 turns on the switches 411, 422, 432 and 433, and turns off the switches 415, 431 and 434. At this time, a detection voltage that is outputted from the power detecting circuit 33 in response to the power of the surface emitting laser 31 is provided into the difference amplifying circuit 34. At this time, the switch SWfb1 is turned on in the difference amplifying circuit 34, and the inputted detection voltage is applied to the error amplifier 342 as its inverting input via the switch 341.

If so, the error amplifier 342 amplifies a difference between the detection voltage of the power detecting circuit 33 and the reference voltage Vref thereof and output the same. The output voltage of the error amplifier 342 is provided into the drive control circuit 32-1. The output voltage is held in a capacitor 412 via the switch 411 in the drive control circuit 32-1, that is, the drive controlling circuit 32 shown in FIG. 16. Thereby, the operational amplifier 413 controls a current of the constant current source 424 via the inverter 421 and switch 422 on the basis of the voltage held by the capacitor 412.

Thereby, the current that is provided from the constant current source 424 to the light emitting part LD1 of the surface emitting laser 31 via switches 432 and 433 changes. Resultantly, the laser power of the light emitting part LD 1 of ch1 is controlled. With this feedback control, finally, the detection voltage of the power detecting circuit 33 is consistent with the reference voltage Vref and converges. A series of the above control are the APC.

After that, if the switch SWfb1 of the difference amplification circuit 34, switch 422 of the current drive circuit 42, and switch 411 of the voltage drive circuit 41 are turned off, the respective control voltages are held in the capacitors Cfb1, 423 and 412. At this time, voltages that are held in the capacitors Cfb1, 423 and 412 are, respectively, an output voltage of the error amplifier 342 in respective ch1, a control voltage by which the drive current corresponding to the light emitting part LD1 is established, and a voltage corresponding to the terminal voltage of the light emitting part LD1 at this time.

By the above-described operations being repeated equivalently to the number (in the example, 36 times) of the light emitting parts LD of the surface emitting laser 31, all the control voltages of the drive control circuits 32-1 through 32-36 for 36 channels are held in 36 capacitors Cfb1 through Cfb36 that are connected between the inverting input terminal and output terminal of the error amplifier 342. And, after the APC for 36 channels is completed, the switch 341 is turned off in the difference amplification circuit 34, and at the same time, the switch SWfb1 is turned on, wherein the control voltage in ch1, is prepared for the next APC as an output voltage of the error amplifier 342.

As described above, the surface emitting laser driving apparatus according to the second embodiment is provided with a voltage drive circuit 41 that drives the surface emitting laser 31 in terms of voltage, and a current drive circuit 42 that drives the surface emitting laser 31 in terms of a current, wherein by changing over the voltage drive which is brought about by the voltage drive circuit 41 and the current drive which is brought about by the current drive circuit 42, it is possible to effectively combine the advantages by the voltage drive and those by the current drive, and more idealistic drive control can be achieved.

In particular, the voltage drive by the voltage drive circuit 41 is employed in the period of rise of pulse data that are input data, and the voltage drive is changed to the current drive by the current drive circuit 42 after the rise, wherein the surface emitting laser 31 can be instantaneously driven to emit light in response to the rise of the pulse data, and at the same time, it is possible to prevent the power from fluctuating as in the case where the voltage drive is continued after the rise of the pulse data.

However, as described previously, the surface emitting laser 31 is heated by flowing of a current, and the temperature rises in response to the current. As has been made clear in the timing waveform chart of FIG. 17, power shift may occur in the power (D), resulting from a fluctuation ΔT in temperature, in line with the rise of the temperature of the surface emitting laser 31, when driving the surface emitting laser 31 next. Although in normal drive control the power shift like this is so small as can be disregarded, it is preferable in view of achieving more reliable drive control that such power shift of a fluctuation ΔT in temperature is not provided. An apparatus for driving a light emitting element according to a third embodiment, which will be described later, is provided with a feature of compensating the power shift of a fluctuation ΔT in temperature.

Embodiment 3

Figure 22:
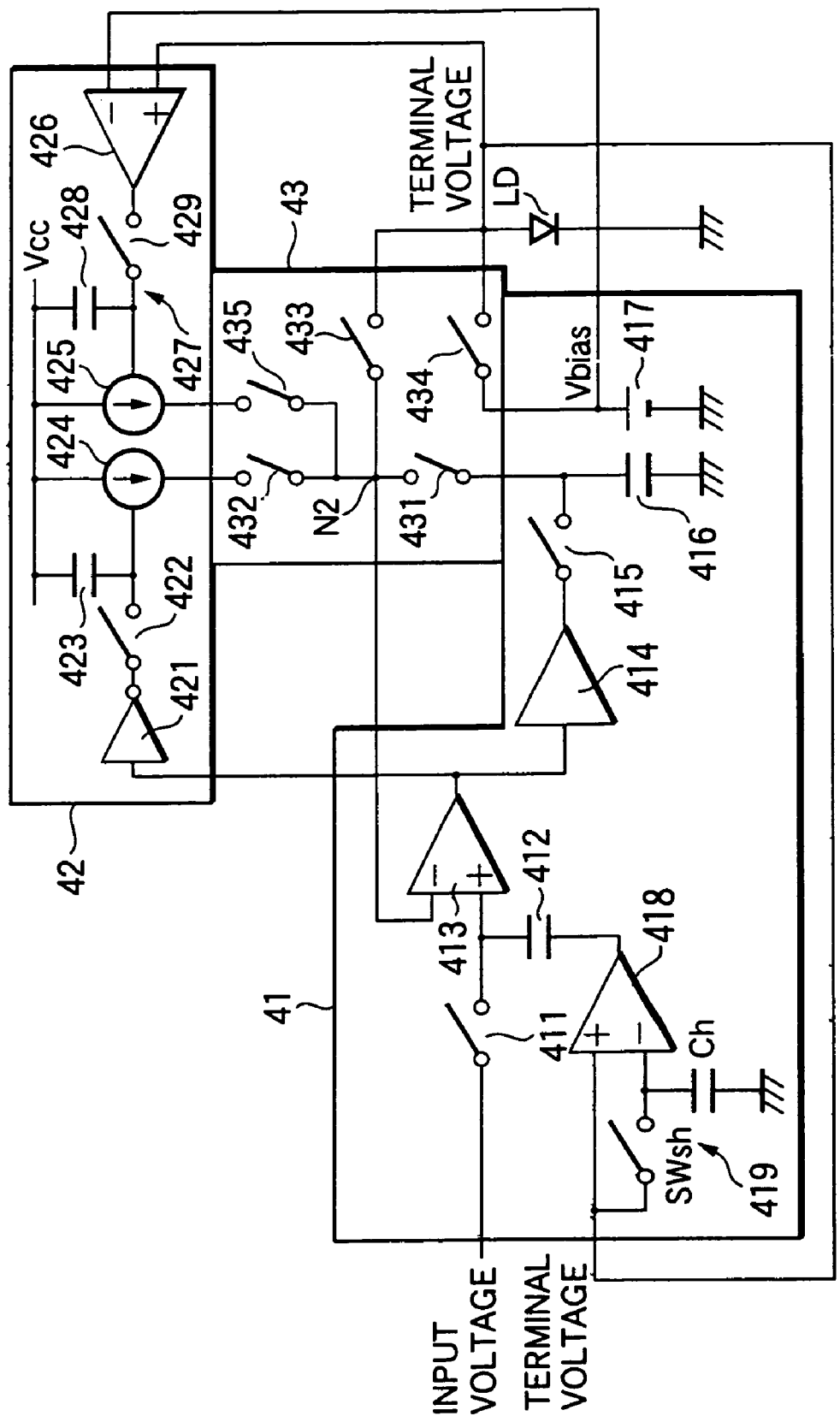
FIG. 22 is a circuit diagram showing a circuit configuration a drive control circuit in an apparatus for driving a surface emitting laser according to a third embodiment.

FIG. 22 is a circuit diagram showing a configurational example of a drive control circuit of an apparatus for driving a light emitting element according to the third embodiment of the present invention, that is, for example, a surface emitting laser driving apparatus. In the same drawing, parts that are similar to those in FIG. 16 are given the same reference number. Also, a difference thereof from the surface emitting laser driving apparatus according to the second embodiment resides in only the construction of the drive control circuit 32. Therefore, where constructing a drive system, the construction thereof is basically the same as that in FIG. 15.

In FIG. 22, the voltage drive circuit 41 and the current drive circuit 42 are, respectively, provided with a circuit for compensating a power shift for a fluctuation ΔT in temperature. In detail, the compensation circuit of the voltage drive circuit 41 is composed of an error amplifier 418 and a sample hold circuit 419. A terminal voltage (detection voltage) of the light emitting part LD of the surface emitting laser 31 is applied to the error amplifier 418 as the non-inverting (+) input.

Herein, as a constant current is flowing into the light emitting part LD of the surface emitting laser 31, the terminal voltage may fluctuates in response to the temperature of the light emitting part LD. In detail, as the temperature of the element rises, the terminal voltage is lowered. Therefore, by detecting the terminal voltage f the light emitting part LD of the surface emitting laser 31, it is possible to monitor the temperature of the corresponding light emitting part LD.

Also, the method for monitoring the temperature of the light emitting part LD is not limited to the method for detecting the terminal voltage of the light emitting part LD. For example, a method for using a detection output of the corresponding temperature detecting means with temperature detecting means such as a thermister, etc., disposed in the vicinity of the surface emitting laser 31 may be employed. However, in the case of the method for detecting a terminal voltage of the light emitting part LD has an advantage by which the temperature of the light emitting part LD can be monitored more quickly and accurately.

The sample hold circuit 419 is composed of a sampling switch SWsh and a hold capacitor Ch, wherein the terminal voltage of the light emitting part LD is sampled by the sampling switch SWsh, and the sampled voltage is held in the hold capacitor Ch. The voltage that is held by the hold capacitor Ch becomes a reference voltage, and is applied to the error amplifier 418 as the inverting (−) input. The output end of the error amplifier 418 is connected to an open end of the capacitor 412.

In the compensating circuit of the voltage drive circuit 41, the sampling switch SWsh is turned on, for example, at the timing before entering the APC period described above, the terminal voltage of the light emitting part LD is sampled. Thus, by sampling the terminal voltage at the timing before entering the APC period, the terminal voltage that is stable before the temperature of the surface emitting laser 31 rise can be sampled, and the sampled voltage may be used for subsequent compensating processes.

That is, the error amplifier 418 picks up the terminal voltage of the light emitting part LD of the surface emitting laser 31 as a non-inverting input, and compares the same with the hold voltage of the hold capacitor Ch, that is, the reference voltage, wherein the difference amplification voltage is applied to an open end of the capacitor 412. Thereby, the voltage that is held by the capacitor 412 may shift by the difference amplification voltage. That is, the difference amplification voltage overlaps the voltage held by the capacitor 412 as a compensating value. And, the compensated voltage is applied onto the light emitting part LD when the surface emitting laser 31 is driven to emit light.

On the other hand, the compensating circuit of the current drive circuit 42 is provided with a bias current voltage 425 whose one end is connected to a power source Vcc, an error amplifier 426 in which the terminal voltage of the light emitting part LD of the surface emitting laser 31 is made into a non-inverting input, and a bias voltage Vbias of the bias voltage source 417 is made into an inverting input, a capacitor 428, a switch 429, and a sample hold circuit 427 that samples and holds a difference amplification voltage of the error amplifier 426, and is constructed so that the bias current Ibias of the bias current source 425 is controlled in response to the hold voltage, which is held in the capacitor 428 of the sample hold circuit 427. As a result, a bias current Ibias is outputted from the bias current source 425 in response to the bias voltage Vbias.

The switch circuit 43 further includes a switch 435 that is connected between the other end of the bias current source 425 and the node N2. The switch 435 is turned on when the current drive is carried out, after elapse of the period of fall of input data, in the OFF period of input data, that is, in the period during which the laser is turned off, under control brought about by the control circuit 35 (See FIG. 15). At this time, the switch 432 is turned off under control brought about by the control circuit 35.

Thereby, when the current drive is carried out, after elapse of the period of fall of input data, in the period during which the laser is turned off, a bias current Ibias is provided into the light emitting part LD of the surface emitting laser 31 instead of the drive current from the constant current source 424.

Figure 23:
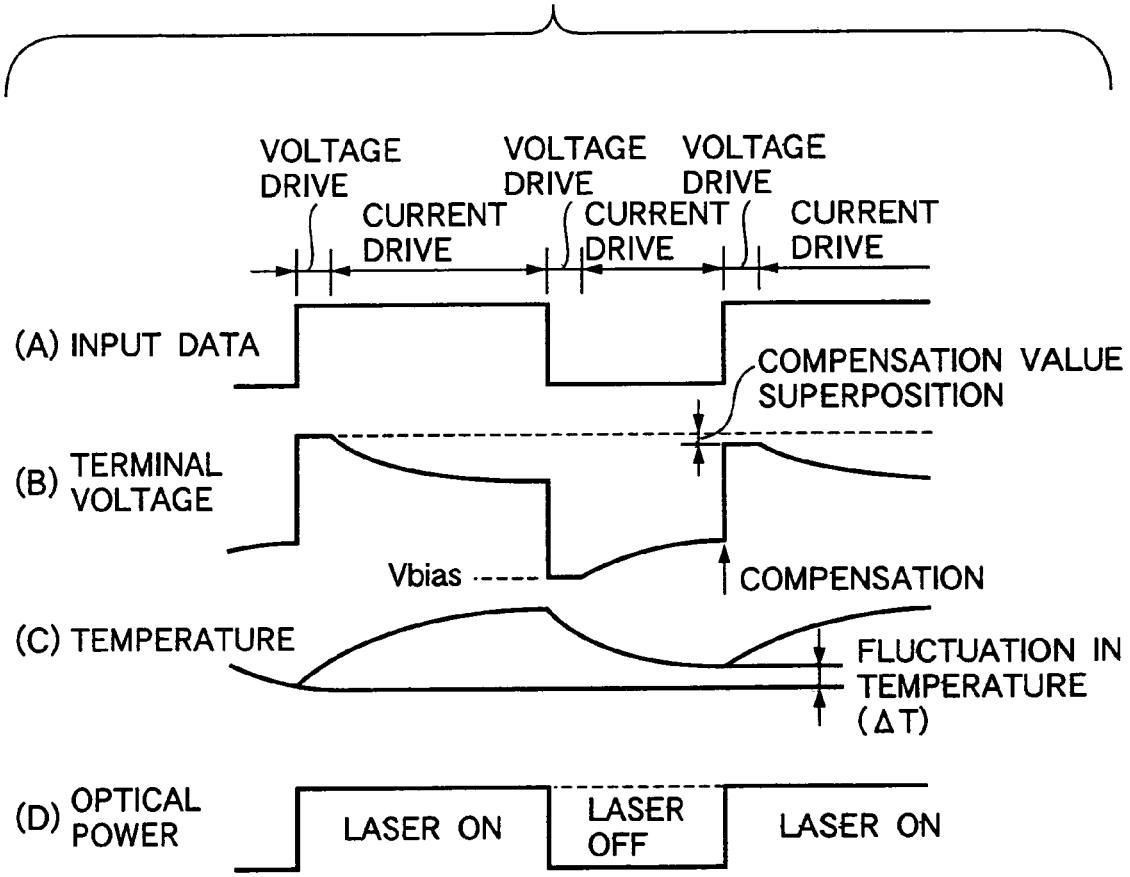
FIG. 23 is a timing wave form diagram for explaining operation of the drive control circuit according to the third embodiment.

Next, a description is given of operations of the drive control circuit 32, constructed as described above, which is provided with a compensating circuit for compensating a power shift of a fluctuation ΔT in temperature, using the timing waveform chart in FIG. 23.

In the timing waveform chart in FIG. 23, (A) indicates a waveform of input data (pulse data), (B) indicates a waveform of the terminal voltage of the surface emitting laser 31, (C) indicates a waveform of temperature of the surface emitting laser 31, and (D) indicates a waveform of the power in the surface emitting laser 31.

Also, the third embodiment is the same as the second embodiment in that, in the period of light emission of the surface emitting laser 31, the voltage drive is carried out in the period of rise of input data, and thereafter the voltage drive is changed to the current drive. However, in the third embodiment, after the voltage drive is carried out in the period of fall of input data (A), a current that is the threshold current of laser emission or less is caused to flow, and the current drive is employed. In the period during which the laser is turned off, the compensating circuit of the voltage drive circuit 41 operates to perform an action of compensating the power shift of a fluctuation ΔT in temperature.

In detail, the error amplifier 418 compares the terminal voltage of the light emitting part LD of the surface emitting laser 31 with the hold voltage of the hold capacitor Ch, and the difference amplification voltage is applied to an open end of the capacitor 412. Thereby, the difference amplification voltage is caused to overlap the holding current of the capacitor 412 as a compensating value. The overlapped voltage is applied onto the light emitting part LD of the surface emitting laser 31, as shown in FIG. 23(A), as the compensated voltage. As a result, the power shift in a fluctuation ΔT in temperature can be compensated, and the power (D) can be made constant even if any fluctuation ΔT in temperature remains.

If the period during which the laser element is turned off is sufficiently long, there is no problem in compensating the rise voltage of the next pulse data. However, where an attempt is made to control image density in a high image density area in laser xerography, the period during which the laser is turned off is made short. In such a case, since it is impossible to shift to the constant current drive in a short period during which the laser is turned off, a fluctuation in temperature of the laser element cannot be accurately detected, and the rise voltage of the next pulse data cannot be correctly compensated. Where the period during which the laser is turned off is very short, since a fluctuation in temperature in the period during which the laser is turned off can be disregarded, it is possible to compensate with the laser temperature when the laser is turned on right before the laser element is turned off.

When the laser is turned on, a fluctuation in temperature of the laser can be known by detecting a fluctuation in the terminal voltage of the laser element as in the case where the laser is turned off, because the laser element is driven with a low current. However, a current flowing through the laser element when the laser element is turned off is different from that flowing thereinto when the same is turned on, and the terminal potential of the laser element differs. Therefore, a fluctuation in the laser terminal voltage when the laser is turned off if it is turned off, and a fluctuation therein when the laser element is turned on if it is turned on may be alternately outputted.

In detail, in the automatic power control (APC), the laser terminal voltage when the laser element is turned on, and the laser terminal voltage when the laser element is turned off at the laser temperature are detected and held. It is possible to detect a fluctuation in temperature of the laser element when it is turned on and off, and these laser terminal voltage are used as references, wherein, by subtracting the held voltage in turning-on of the laser element from the laser terminal voltage when carrying out modulation and subtracting the held voltage in turning-off of the laser element, when the laser element is turned off, therefrom, it is possible to detect a fluctuation in temperature of the laser element when the laser element is turned on and off. Or, by alternately outputting a differential voltage between the laser terminal voltage and the held voltage when the laser element is turned on and a differential voltage between the laser terminal voltage and the held voltage when the laser element is used, it is also possible to detect a fluctuation in temperature of the laser element when the laser element is turned on and off, as in the above.

In FIG. 22, principally, the error amplifier 418 having one system of sample hold circuit for retaining the reference voltage at the input side thereof is shown one system. However, in order to realize the former, for example, it is considered to configure so that as with FIG. 22, the error amplifier 418 is one system and the sample hold circuit for retaining the reference voltage at the input side thereof is two systems for turning-on and turning-off. In order to realize the latter, it is considered to configure so that the error amplifier having the sample hold circuit as with the error amplifier 418 and capable of selectively outputting is two systems for turning-on and turning-off, the output is connected to open end of the capacitor 412 as a wired OR, and a connection point in relation to the capacitor 412 is earthed through a resistance.

Further, herein, as to the reference voltage for subtraction, the voltage for carrying out automatic power control (APC) is held and used. However, as long as the compensation becomes zero, it does not matter whether the reference voltage is taken from the APC or from others.

The above is an action of a drive control circuit according to the third embodiment in the period of modulation. A difference of the third embodiment from the drive control circuit according to the second embodiment resides in the following point. That is, in the drive control circuit according to the second embodiment, a bias voltage Vbias is continuously applied in the period during which the laser element is turned off. However, although the bias voltage Vbias is once applied in the drive control circuit according to the third embodiment, a bias current is thereafter caused to flow, using the bias current source 425 in FIG. 22, and the current drive mode is employed, whereby it is possible to predict the temperature based on a fluctuation in the terminal voltage of the laser element.

Also, the bias current source 425 is driven by an output of the error amplifier 426 in which the laser element is turned off subsequent to the APC mode in the drive control circuit according to the second embodiment, the laser terminal voltage is made into a non-inverting input in FIG. 22 and the bias voltage Vbias is made into an inverting input. At the same time, the then control voltage is charged into a capacitor 428 that is connected to the power source Vcc side of the sample hold circuit 427, and the switch 427 is turned off at the point of time when the output voltage of the error amplifier 426 converges. Thereby, a bias current for which the laser terminal voltage is almost consistent with the bias voltage Vbias will be established in the bias current source 425.

In addition, if a voltage applied onto the control terminal corresponding to the gate of the PMOS transistor is raised since a PMOS transistor is assumed as the bias current source 425 as in the constant current source 424, the current of the bias current source 425 decreases, and if the voltage is lowered, the same current increases. Therefore, after the laser terminal voltage is made into the bias voltage Vbias in the period of fall of pulse data when the laser is turned off in the period of modulation, the fluctuation in the corresponding terminal voltage is minimized, and a quick shift to the current mode can be achieved.

As a result, the temperature of the laser element can be monitored in a short time after the laser element is turned off, wherein it becomes possible to compensate the voltage for the next turning-on of the laser element. This is important in effecting the compensation when driving the laser element to emit light in a very short cycle particularly in high light in laser xerography as shown in FIG. 24 as the period of modulation.

As described above, since the drive control circuit 32 in a surface emitting laser driving apparatus according to the third embodiment is provided with a compensating circuit by which the voltage drive circuit 41 and the current drive circuit 42 respectively compensate a power shift of a fluctuation $\Delta T$ in temperature, the power shift resulting from the fluctuation $\Delta T$ in temperature can be securely compensated even if a fluctuation $\Delta T$ in temperature remains in line with an increase in temperature of the surface emitting laser 31. Therefore, no shift in the fluctuation $\Delta T$ in temperature is produced in the power (D) when the laser is driven to emit light. Hereinafter, drive accompanying the compensation of the fluctuation in temperature is called "dynamic drive".

Figure 24:
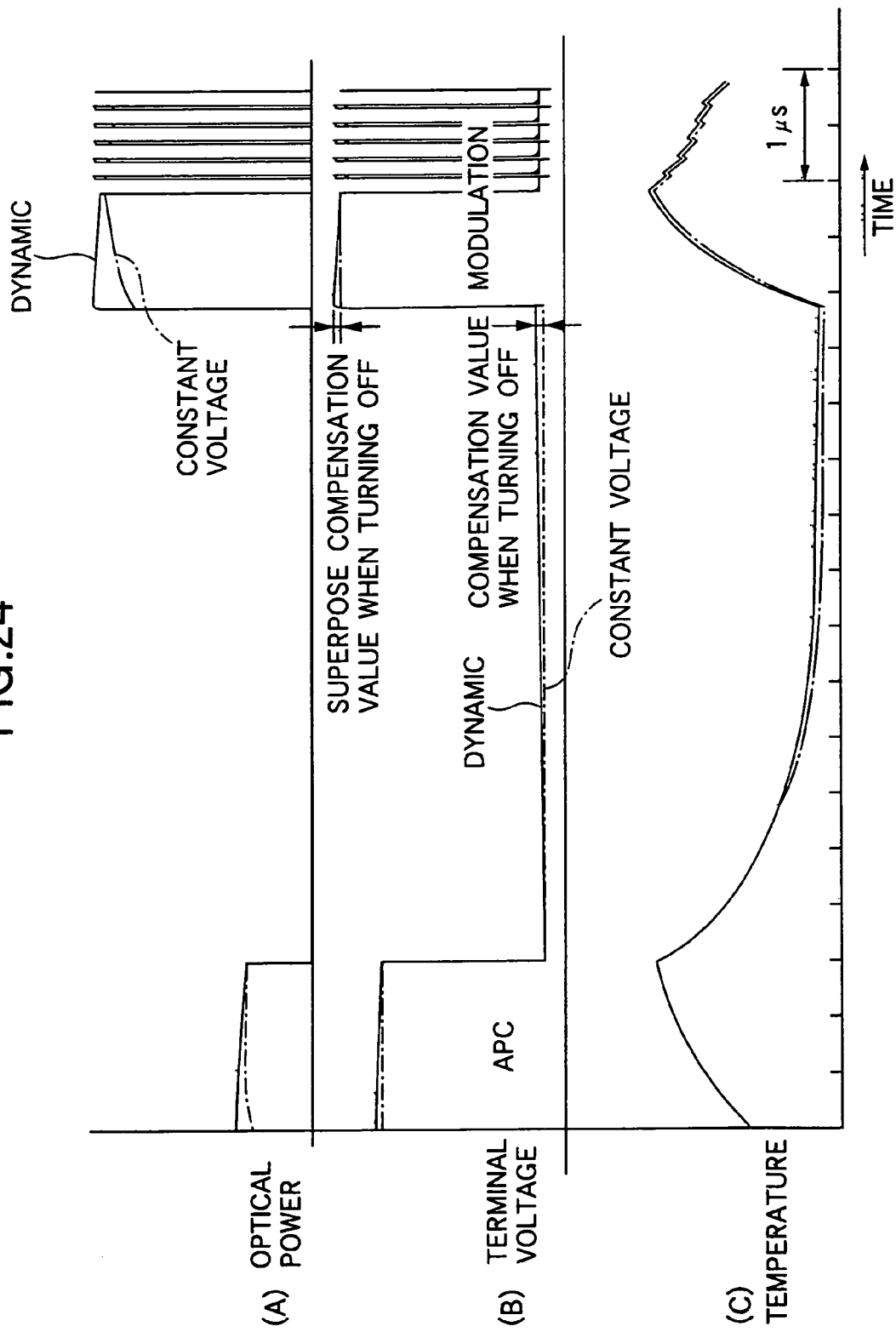
FIG. 24 shows timing waveforms in comparison between dynamic drive and constant voltage drive in the APC period, the turning-off period of the laser and the period of modulation in relation to the optical power of the surface emitting laser (A), terminal voltage (B), and temperature (C).
Figure 25:
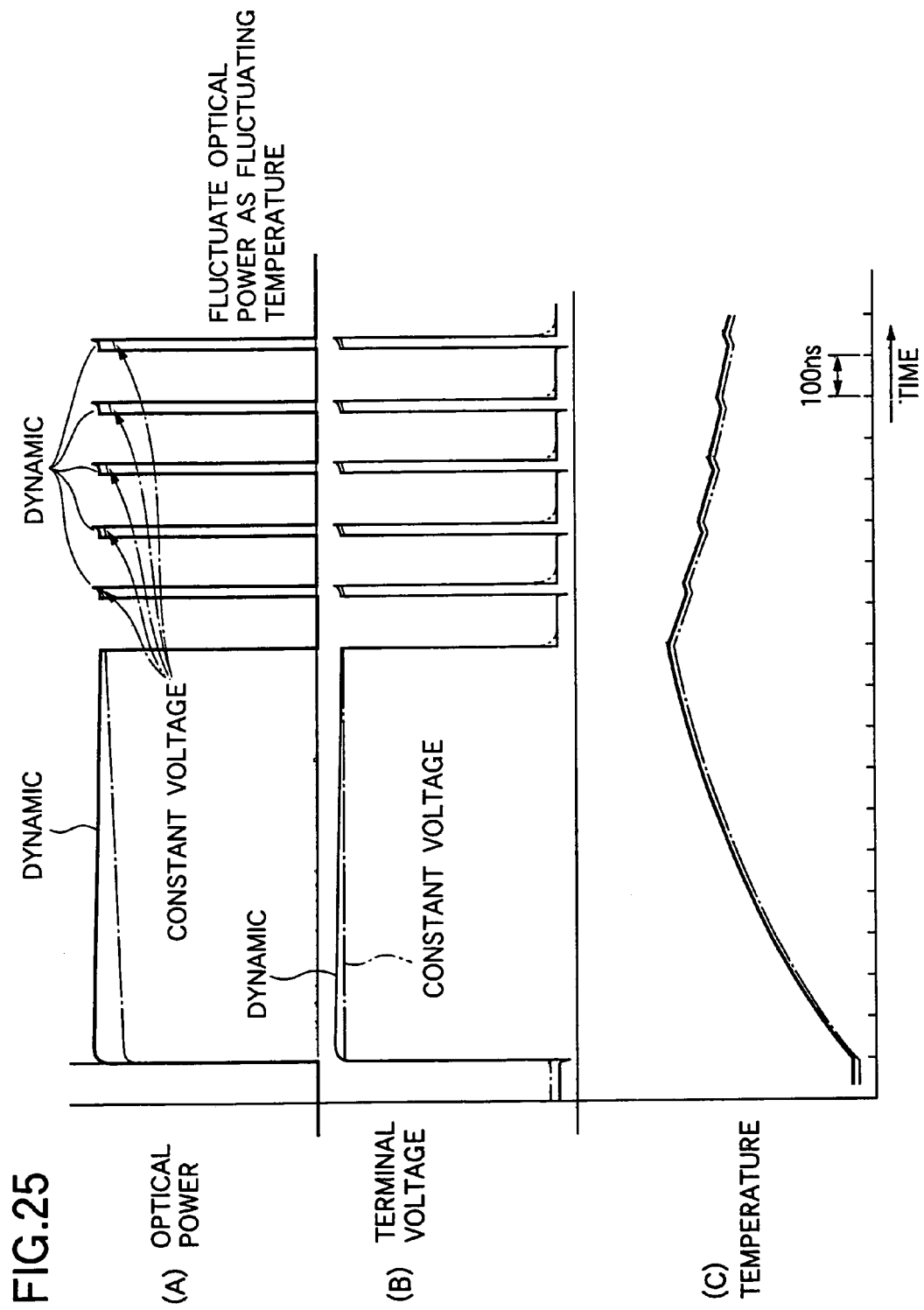
FIG. 25 shows respective waveforms of the optical power of the surface emitting laser (A), the terminal voltage (B) and the temperature (C), enlarging the period of modulation.
Figure 26:
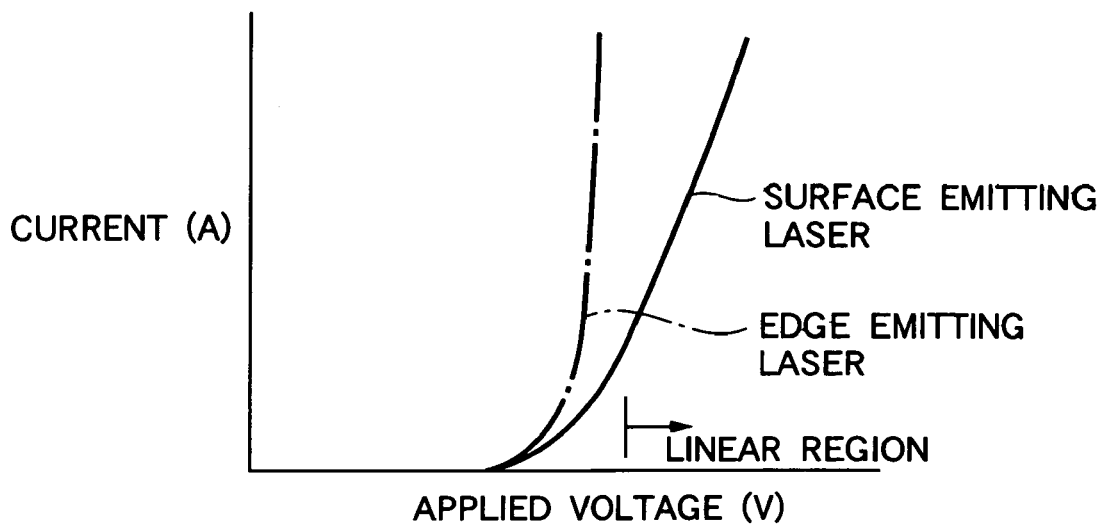
FIG. 26 is a diagram in which the edge emitting laser and the surface emitting laser are compared in V-I characteristic.
Figure 27:
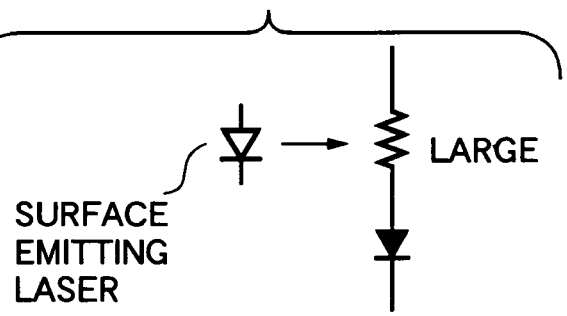
FIG. 27 is a diagram showing an equivalent circuit of the surface emitting laser.
Figure 28:
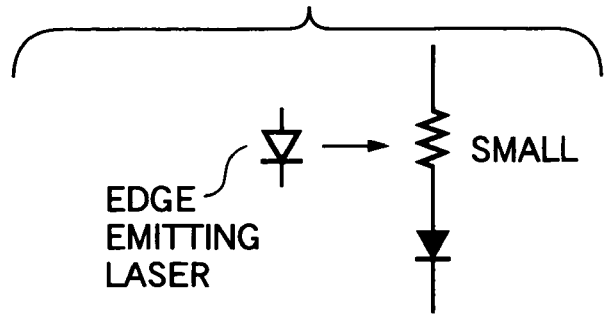
FIG. 28 is a diagram showing an equivalent circuit of the edge emitting laser.
Figure 29:
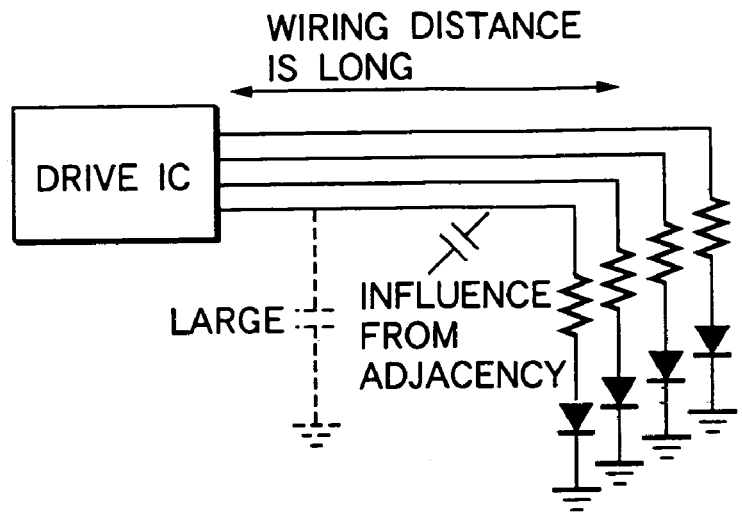
FIG. 29 is a diagram showing wiring of a circuit for driving the surface emitting laser.
Figure 30:
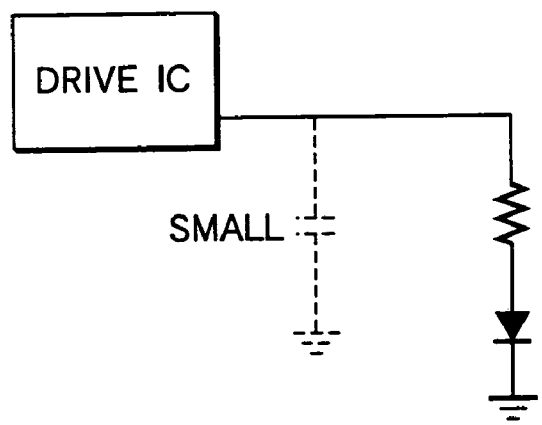
FIG. 30 is a diagram showing wiring of a circuit for driving the edge emitting laser.
Figure 31:
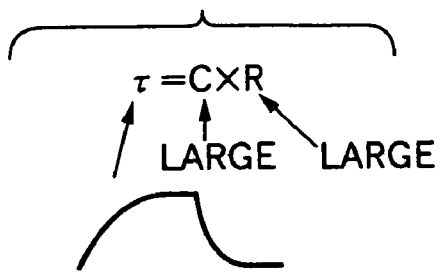
FIG. 31 is a wave diagram of the surface emitting laser.
Figure 32:
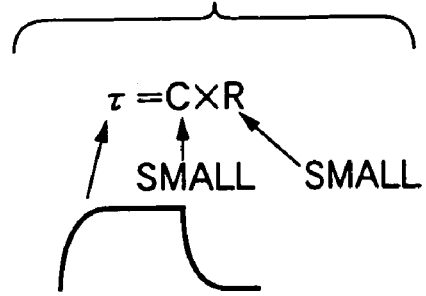
FIG. 32 is a wave diagram of the edge emitting laser
Figure 33:
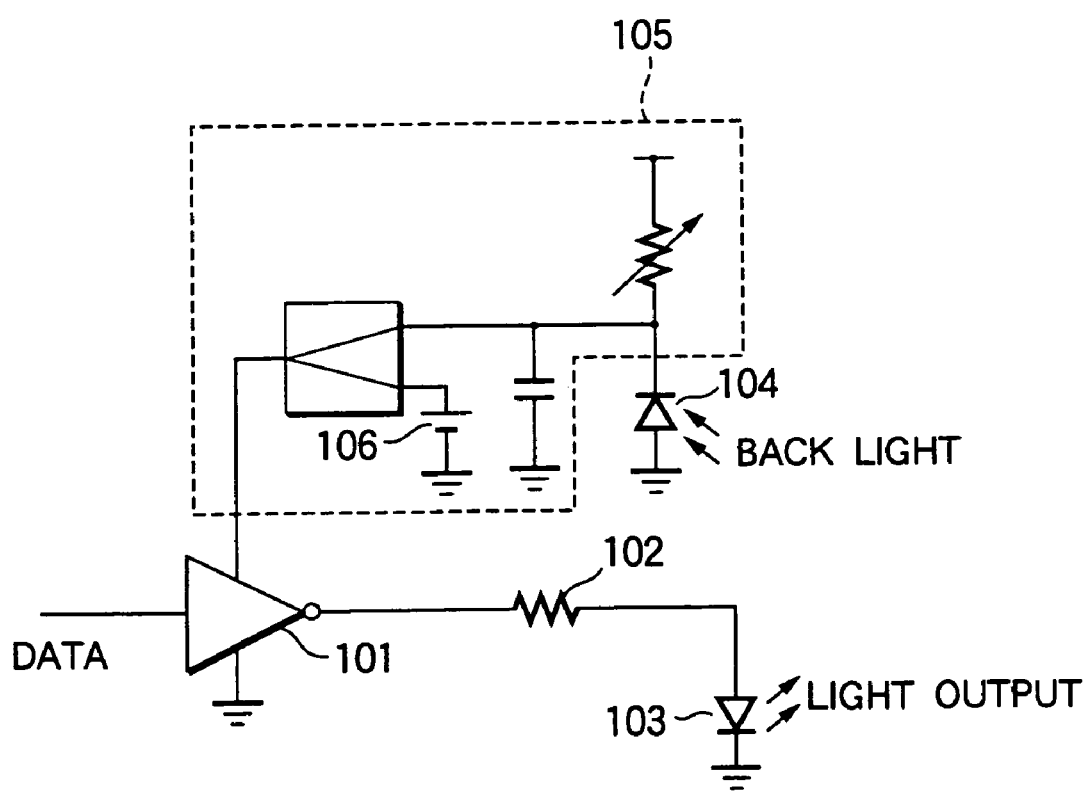
FIG. 33 is a circuit diagram showing a circuit configuration of a circuit for driving a voltage-drive type laser according to the related art.

With respect to the power (A), terminal voltage (B) and temperature (C) of the surface emitting laser 31, FIG. 24 shows waveforms in comparison between the case of the dynamic drive shown by a solid line and the case of constant voltage drive shown by a dashed line in the APC period, the turning-off period of the laser and the period of modulation. Also, FIG. 25 shows respective waveforms of the power (A), terminal voltage (B) and temperature (C) of the surface emitting laser 31, enlarging the period of modulation. As has been made clear from these waveform charts, since, by carrying out the dynamic drive shown by a solid line, it is possible to securely compensate a power shift resulting from the fluctuation $\Delta T$ in temperature, it can be found that the power (A) becomes more constant than in the case of constant voltage drive shown by a dashed line.

Also, in the third embodiment, a description was given of the method for compensating a rise voltage of pulse data as the subject of compensating the temperature dependency of the laser element by detecting the laser temperature from the laser terminal voltage. However, the subject of compensation covers all the characteristics having the temperature dependency of the laser characteristics. In detail, the method is applicable to compensate the dependency of the threshold current and light emission efficiency ($\Delta P$: Power/$\Delta I$: Drive current) upon temperature.

As described above, according to the first aspect of the invention, a light emitting element is driven by substantially directly applying a voltage corresponding to input data to a drive end of the light emitting element that emits light by causing a direct current to flow thereto. In the apparatus for driving a light emitting element, which is constructed as described above, no resistance component that becomes a factor of suppressing the modulation speed intervenes between the corresponding driving apparatus and a drive end of the light emitting element which becomes a subject to be driven. Therefore, since the light emitting element can be substantially directly driven with voltage, a higher modulation speed can be achieved. In particular, the apparatus includes a voltage source and switching section that is inserted between the voltage source and the light emitting element and is controlled on the basis of the input data, in which the resistance value from the output end of the voltage source to the drive end of the light emitting element is established to be lower than the internal resistance value of the light emitting element. Whereby the time constant of rise of a drive voltage of the light emitting element can be decreased. Therefore, it is possible to drive the light emitting element rapidly. Furthermore, even when high speed drive is achieved by the current flowing through the voltage source being smaller than the current flowing through the light emitting element, the power consumption can be suppressed low in the voltage source, and the entire power consumption of the driving apparatus can be achieved, and the circuit integration thereof can be facilitated.

According to the second aspect of the invention, the power source has the buffer amplifier having the negative feed back loop. Whereby since the output impedance can be established to be so small to disregard the same, it is not necessary to device a countermeasure such as providing a decoupling capacitor in the integration circuit to decrease the output impedance or increasing the bias current. Thus, there is no restriction on integration circuit and the light emitting element can be driven without increasing consumption power. Since the output potential of the switching section can be controlled to be fixed regardless of the load current, it is possible to prevent the drive voltage from fluctuating in line with ON/OFF of the switching section.

According to the third aspect of the invention, the voltage source has a capacitance section at an output of the buffer amplifier and the capacitance section of the voltage source has greater capacitance than the capacitance value of parasitic capacitance of the light emitting element, when being observed from the switching section. The capacitance section can compensate a decrease in the lowering effect of the output impedance due to negative feedback in line with a frequency. Also, since the capacitance value is larger than the capacitance value of the parasitic capacitance of the light emitting element when being observed from the switching section, it is possible to prevent the output voltage from fluctuating regardless of the load. Therefore, overshoot of the light emitting element while turning on can be prevented.

According to the fourth aspect of the invention, since the output voltage of the voltage source and the bias voltage are adequately changed over appropriately, and the bias voltage is applied in advance to the light emitting element when the light emitting element is turned off, it is possible to suppress, to a low level, the amplitude of the voltage applied from the voltage source to the light emitting element when driving the light emitting element.

According to the fifth aspect of the invention, the input side retaining section retains control voltage when controlling the optical power, whereby it becomes possible from this that the light emitting element is modulated at desired optical power in an image data region (modulation region) without negative feed back control. Thus, shift to automatic optical power control mode can be performed smoothly.

According to the sixth aspect of the invention, a first voltage which causes the laser element to be a forward biasing state and is lower than a threshold voltage of laser oscillation and a second voltage which causes the laser element to be a forward biasing state and is larger than the threshold voltage of laser oscillation are changed appropriately and applied directly to the drive end of the light emitting element. Whereby since the amplitude of the second voltage applied to the laser element when driving the laser, shift to the laser drive (modulation) mode can be performed fast. Since a current flowing through the second voltage source is set to be smaller than that flowing into the laser element, even when high speed drive is achieved by the current flowing through the voltage source being smaller than the current flowing through the light emitting element, the power consumption can be suppressed low in the voltage source, and the entire power consumption of the driving apparatus can be achieved, and the circuit integration thereof can be facilitated.

According to the seventh aspect of the invention, the surface emitting laser being more advantageous in view of structure than an edge emitting laser in terms of increasing the number of laser light beams, for example, in the field of xerography, is used as a laser light source, whereby the surface emitting laser greatly contributes to high resolution power and high speed.

According to the eighth aspect of the invention, the surface emitting laser element includes a plurality of light emitting parts emitting a plurality of laser beams and the first voltage is commonly applied to at least two of the light emitting parts of the plurality of light emitting parts. Whereby it does not become necessary to provide voltage sources to apply the first voltage, equivalent to the number of the light emitting parts. Therefore, the circuit configuration of the entire voltage source can be simplified.

According to the ninth aspect of the invention, in the first and second voltage sources having a negative feedback amplifying circuit and a capacitance which has a larger capacitance value than the capacitance of parasitic capacitance of the laser element when being observed from the switching section, a resistance value from the output of the buffer amplifier to the laser element is smaller than a differential resistance value of the laser element when the laser emits light. Whereby since the time constant of rise of the drive voltage of the laser element can be made small, the laser element can be driven rapidly.

According to the tenth aspect of the invention, the input side retaining section retains the control voltage when the optical power is controlled, whereby it becomes possible from this that the light emitting element is modulated at desired optical power in an image data region (modulation region) without negative feed back control. Therefore, shift to the automatic optical power control mode can be performed smoothly.

According to the eleventh aspect of the invention, the apparatus further has a current supplying section for supplying a compensation current, which compensates a fluctuation of an output current of the negative feedback amplifying circuit due to changing of the switching section, to the drive end of the laser element and the compensation current is made to flow into the drive end of the laser element in synchronous with the change of the switching section. Whereby it is possible to suppress the fluctuation in the output current of the negative feedback circuit irrespective of a state of the switching section. Therefore, it can be prevented that the voltage of the power source transitionally fluctuates due to fluctuation of load when the switching section is turned on.

According to the thirteenth aspect of the invention, in the current supplying section for supplying the compensation current to the drive end of the laser element, since an MOS transistor of the current source and an MOS switch thereof are formed of dual gate MOS transistors, the capacitance value of the parasitic capacitance of the source-drain at the connection portion of both transistors can be minimized. Therefore, response speed of the current source composed of MOS transistors can be accelerated.

According to the fourteenth aspect of the invention, voltage drive by the voltage driving section and current drive by the current driving section can be switched on the basis of input data, wherein it is possible to effectively combine advantages, which are brought about by the voltage drive, with those which are brought about by the current drive. Therefore, drive control nearer to the ideal can be achieved.

According to the fifteenth aspect of the invention, since voltage drive which is brought about by the voltage driving section is employed, for example, in the period of rise of pulse data, and current drive which is brought about by the current driving section is employed after the rise of pulse data, wherein the light emitting element can be instantaneously driven in response to the rise of pulse data, and at the same time, it is possible to prevent the optical power of the light emitting element from fluctuating as in a case where the voltage drive is continued even after the rise of the pulse data.

According to the sixteenth aspect of the invention, as the output current of the voltage driving section fluctuates due to a fluctuation in load, the terminal voltage of the light emitting element fluctuates at the moment when being changed by the changing section. However, the current drive which is brought about by the current driving section is simultaneously selected when employing the voltage drive by the voltage driving section, and a current which is brought about by the corresponding current drive is provided to the light emitting element as a compensation current, whereby it is possible to suppress a fluctuation in the terminal voltage of the light emitting element.

According to the seventeenth aspect of the invention, the bias voltage applying section for applying the bias voltage to the light emitting element is provided and a bias voltage is applied in advance to a light emitting element by the bias voltage applying section when the light emitting element is turned off, whereby it is possible to suppress, to a low level, the amplitude of a voltage applied from the voltage source to the light emitting element when driving the light emitting element.

According to the eighteenth aspect of the invention, since the voltage corresponding to the input voltage is retained in the output side retaining section, the retaining voltage can be instantaneously applied to the light emitting element when being changed to the voltage drive.

According to the nineteenth aspect of the invention, as laser drive in the laser xerography, turning on and turning off is controlled in accordance with the image and the optical power control can not be performed during the control of the turning on/off. However, if the input side retaining section retains the voltage corresponding to the voltage of the optical power control (control voltage), it becomes possible from this that the light emitting element can be modulated at desired optical power in the image data region (modulation region) without negative feedback controlling.

According to the twentieth aspect of the invention, a current that is outputted from the constant current source can be supplied to a light emitting element as a compensation current and can be supplied to the light emitting element as a drive current when carrying out current drive. Therefore, more secure control can be realized.

According to the twenty-first aspect of the invention, temperature rising of the light emitting element reduces the terminal voltage of the light emitting element at the same optical power. However, if it is continued to be applying the same voltage to the light emitting element, the drive current increases and as a result, the optical power also increases. Therefore, since at least the voltage of the rise of the pulse data (positive logic) is compensated corresponding to the fluctuation in temperature, whereby even if the fluctuation in temperature occurs in the light emitting element, optical power shift due to fluctuation amount in temperature can be compensated, more secure control can be realized. Not only the rise of the pulse data (positive logic) but also the fall of the pulse data are compensated, whereby for example, it can also prevented that erroneous light emission is caused by fluctuation in laser oscillation threshold value due to the fluctuation in temperature.

According to twenty-second aspect of the invention, the terminal voltage fluctuates in response to temperature of a light emitting element as a constant current flows into the light emitting element. Since it is possible to more quickly and more accurately monitor the temperature of the light emitting element by detecting the corresponding terminal voltage, the temperature can be securely compensated.

According to the twenty-third aspect of the invention, changing to the voltage drive by the voltage driving section in the period of rise of the pulse data, thereafter changing to the current drive by the current driving section, subsequently changing to the voltage drive by the bias voltage applying section in the period of fall of the pulse data, and changing to the current drive by the bias current supplying section in a period of off of the pulse data to supply the bias current to the light emitting element, when the light emitting element is shifted to the current drive after the light emitting element is voltage-driven at the bias voltage at the period of the fall of the pulse data, if the current value in the current drive is a current value corresponding to the bias voltage, the light emitting element can smoothly be shifted to the current drive. Therefore, when the terminal voltage in the current drive is detected to perform temperature compensation, a period in which the temperature compensation can not effect is made to be as small as possible.

According to the twenty-fourth aspect of the invention, since the retaining voltage of the input side retaining section is compensated on the basis of the terminal voltage of the light emitting element, the compensated voltage is applied to the light emitting element via the output side retaining section. Therefore, it is possible to carry out compensation of the temperature when executing voltage drive.

According to the twenty-fifth aspect of the invention, the terminal voltage of the light emitting element is compared with the terminal voltage at a time when the retaining voltage of the input side retaining section is set and the retaining voltage of the input side retaining section is compensated on a basis of the error. Whereby the temperature compensation can be performed so that even if the temperature of the light emitting element fluctuates, the optical power becomes constant.

According to the twenty-sixth aspect of the invention, in setting of the bias current of the light emitting element before modulation operation, the bias current is controlled so that the control voltage at that time is retained while the terminal bias of the light emitting element is coinciding with the bias voltage, thereafter the bias voltage is applied to the drive end of the light emitting element in the period of fall of the pulse data, and subsequently the current drive is performed by the bias current due to the retained control voltage. Whereby since shift to the current drive can be performed smoothly, if the turning off time is short, it is accurately performed to compensate the voltage at the period of rise of the pulse data in accordance with temperature.

According to the twenty-seventh aspect of the invention, a period of the voltage drive by the voltage driving section is set less than the minimum pulse width of the pulse data. Whereby the light emitting element can be securely driven in response to the rise (or fall) with respect to pulse data of any pulse width.

According to the twenty-eighth aspect of the invention, since the terminal voltage varies in accordance with the temperature of the light emitting element, the temperature of the light emitting element is monitored speedy and accurately by detecting the terminal voltage. Therefore, the temperature compensation can be performed steadily.

According to the twenty-ninth aspect of the invention, since the capacitor is a single element, configuration of the circuits can be remarkably facilitated by employing the capacitor as the input side retaining section and the output side retaining section.

According to the thirtieth and thirty-second aspects of the invention, the optical power of a light emitting element is detected, and the same is fed back to the respective apparatuses for driving light emitting elements, whereby the respective optical power of a plurality of light emitting elements are controlled to be fixed at all times. Therefore, the system for driving a light emitting element, which can perform accurate drive and control, can be realized.

According to the thirty-first and thirty-third aspect of the invention, negative feedback loops are provided in the error amplifying section, corresponding to the number of apparatus for driving light emitting elements, whereby the optical power can be securely controlled for the respective light emitting diodes.

What is claimed is:

1. An apparatus for driving a light emitting element in response to input data, the light emitting element emitting light by causing a current to flow therethrough, the apparatus comprising:
   a voltage driving section for driving the light emitting element with voltage such that the light emitting element emits light;
   a current driving section for driving the light emitting element with a current; and
   a switching section for changing between voltage drive by the voltage driving section and current drive by the current driving section based on the input data,
   wherein the input data are pulse data,
   the switching section is configured to simultaneously select the voltage drive and the current drive, and simultaneously selects the voltage drive and the current drive based on the input data in a period of rise of the pulse data,
   the voltage driving section includes a bias voltage applying section for applying forward-bias voltage to the light emitting element, and
   the switching section is configured to apply the forward-bias voltage to the light emitting element in a period in which of the pulse data falls.

2. The apparatus according to claim 1, wherein the switching section, after the period of rise of the pulse data, switches off the voltage drive and continuously selects the current drive.

3. The apparatus according to claim 1, wherein the forward-bias voltage is lower than a threshold voltage of oscillation of the light emitting element.

4. An apparatus for driving a light emitting element in response to input data, the light emitting element emitting light by causing a direct current to flow therethrough, the apparatus comprising:
   a voltage driving section for driving the light emitting element with voltage;
   a current driving section for driving the light emitting element with a current; and a switching section for changing between voltage drive by the voltage driving section and current drive by the current driving section based on the input data, wherein the input data are pulse data, wherein the switching section changes to the voltage drive by the voltage driving section in at least one of periods of rise and fall of the pulse data, wherein the voltage driving section includes a negative feedback loop that negatively feeds back an output and amplifies an input voltage and an output side retaining section for retaining voltage corresponding to an output voltage of the buffer section at an output side of the buffer section; and wherein the switching section supplies the voltage retained by the output side retaining section to the light emitting element.

5. The apparatus according to claim 4, wherein the voltage driving section includes an input side retaining section for retaining voltage corresponding to a control voltage when controlling optical power at the input side of the buffer section.

6. The apparatus according to claim 5, wherein the input side and output side retaining sections are capacitors.

7. The apparatus according to claim 4, wherein the current driving section includes a retaining section for retaining a voltage corresponding to the output voltage of the buffer section and a constant current source for outputting a current corresponding to the voltage retained by the retaining section; and wherein the switching section supplies a current outputted from the constant current source to the light emitting element.

8. An apparatus for driving a light emitting element in response to input data, the light emitting element emitting light by causing a direct current to flow therethrough, the apparatus comprising:

a voltage driving section for driving the light emitting element with voltage;

a current driving section for driving the light emitting element with a current;

a switching section for changing between voltage drive by the voltage driving section and current drive by the current driving section based on the input data; and a compensating section for compensating a voltage of at least one of rise and fall of the pulse data, corresponding to a fluctuation in temperature of the light emitting element, wherein the input data are pulse data, and wherein the switching section changes to the voltage drive by the voltage driving section in at least one of periods of rise and fall of the pulse data.

9. The apparatus according to claim 8, wherein the compensating section detects a terminal voltage of the light emitting element and compensates the voltage on a basis of the detection result.

10. The apparatus according to claim 8, wherein the voltage driving section includes a bias voltage applying section for applying a bias voltage to the light emitting element;

wherein the current driving section includes a bias current supplying section for outputting a bias current corresponding to the bias voltage; and wherein the switching section changes to the voltage drive by the voltage driving section in the period of rise of the pulse data, thereafter changes to the current drive by the current driving section, subsequently changes to the voltage drive by the bias voltage applying section in the period of fall of the pulse data, and changes to the current drive by the bias current supplying section in a period of OFF of the pulse data to supply the bias current to the light emitting element.

11. The apparatus according to claim 8, wherein the voltage driving section includes:

a buffer section for amplifying an input voltage;

an output side retaining section for retaining a voltage corresponding to the output voltage of the buffer section at the output side of the buffer section; and an input side retaining section for retaining a voltage corresponding to the control voltage when controlling optical power at the input side of the buffer section;

wherein the switching section supplies the voltage retained by the output side retaining section to the light emitting element; and wherein the compensating section detects a terminal voltage of the light emitting element and compensates the retaining voltage of the input side retaining section on a basis of the detection result.

12. The apparatus according to claim 11, wherein the compensating section has a detecting section for detecting the terminal voltage of the light emitting element; and wherein the compensating section compensates the retaining voltage of the input side retaining section on a basis of the detection result of the detection section.

13. The apparatus according to claim 10, wherein the bias current supplying section detects the terminal voltage of the light emitting element and compensates the bias current so that the detected voltage coincides with the bias voltage.

14. An apparatus for driving a light emitting element in response to input data, the light emitting element emitting light by causing a direct current to flow therethrough, the apparatus comprising:

a voltage driving section for driving the light emitting element with voltage;

a current driving section for driving the light emitting element with a current; and a switching section for changing between voltage drive by the voltage driving section and current drive by the current driving section based on the input data, wherein the input data are pulse data, wherein the switching section changes to the voltage drive by the voltage driving section in at least one of periods of rise and fall of the pulse data, and wherein a period of the voltage drive by the voltage driving section is less than the minimum pulse width of the pulse data.

15. A system for driving light emitting elements, the system comprising:

an apparatus for driving a light emitting element in response to input data, the light emitting element emitting light by causing a direct current to flow therethrough, the apparatus comprising:

a voltage driving section for driving the light emitting element with voltage;

a current driving section for driving the light emitting element with a current; and a switching section for changing between voltage drive by the voltage driving section and current drive by the current driving section based on the input data, a detecting section for detecting optical power of the plurality of light emitting elements; and a error amplifying section for comparing voltage corresponding to the detection result of the detecting section and a reference voltage to amplify the error therebetween, wherein each of the plurality of apparatus for driving light emitting elements drives the light emitting element on a basis of outputs of the error amplifying section.

* * * * *